(12) United States Patent
Homer et al.

(10) Patent No.: US 10,109,345 B2
(45) Date of Patent: Oct. 23, 2018

(54) WRITE ASSIST FOR MEMORIES WITH RESISTIVE BIT LINES

(71) Applicant: AMPERE COMPUTING LLC, Santa Clara, CA (US)

(72) Inventors: Russell Homer, Los Gatos, CA (US); Abhiram Saligram Chandrashekar, Milpitas, CA (US); Alfred Yeung, Fremont, CA (US)

(73) Assignee: AMPERE COMPUTING LLC, Santa Clara, CA (US)

( * ) Notice: Subject to any disclaimer, the term of this patent is extended or adjusted under 35 U.S.C. 154(b) by 0 days.

(21) Appl. No.: 15/980,169

(22) Filed: May 15, 2018

(65) Prior Publication Data

US 2018/0261279 A1    Sep. 13, 2018

Related U.S. Application Data

(63) Continuation of application No. 15/372,581, filed on Dec. 8, 2016.

(51) Int. Cl.

| | |
|---|---|
| *G11C 11/00* | (2006.01) |
| *G11C 11/419* | (2006.01) |
| *H01L 27/11* | (2006.01) |
| *H01L 23/528* | (2006.01) |
| *G11C 11/418* | (2006.01) |

(52) U.S. Cl.
CPC .......... *G11C 11/419* (2013.01); *G11C 11/418* (2013.01); *H01L 23/528* (2013.01); *H01L 27/1104* (2013.01); *H01L 27/1116* (2013.01)

(58) Field of Classification Search
CPC ...... G11C 11/00; G11C 11/419; G11C 11/418

USPC .......................................................... 365/156
See application file for complete search history.

(56) References Cited

U.S. PATENT DOCUMENTS

| | | |
|---|---|---|
| 9,208,860 B2 | 12/2015 | Ngo et al. |
| 9,418,759 B2 | 8/2016 | Badereddine et al. |
| 9,437,281 B2 | 9/2016 | Hsieh et al. |

(Continued)

FOREIGN PATENT DOCUMENTS

WO    WO 2013/137888 A1    9/2013

OTHER PUBLICATIONS

WIPO Application No. PCT/US2017/065021, International Search Report and Written Opinion of the International Searching Authority, dated Mar. 21, 2018, 11 pages.

(Continued)

*Primary Examiner* — Harry W Byrne
(74) *Attorney, Agent, or Firm* — Alston & Bird LLP

(57) ABSTRACT

Techniques efficiently assist in performing write operations in memories with resistive bit lines. A memory can comprise memory cells associated with respective word lines and bit lines. A write assist component can be associated with a subset of the memory cells associated with a bit line. Configuration of the write assist component can be based on the type of transistors employed by write circuits associated with the memory cells. During a write operation, the write assist component adds an additional current path to the ground, or the power supply, or both, at or in proximity to the far end of the write bit line when an appropriate write polarity is applied to the bit line by the driver at the other end of the bit line. This mitigates the effects of resistance of the bit line, which mitigates IR loss of the write signal.

11 Claims, 18 Drawing Sheets

(56) References Cited

U.S. PATENT DOCUMENTS

| | | |
|---|---|---|
| 9,496,020 B2 | 11/2016 | Luan et al. |
| 9,496,028 B2 | 11/2016 | Nii et al. |
| 9,508,420 B1 | 11/2016 | Hunt-Schroeder et al. |
| 9,508,729 B2 | 11/2016 | Liaw |
| 2005/0051832 A1* | 3/2005 | Fukumura ............ H01L 27/115 257/314 |
| 2006/0092737 A1 | 5/2006 | Hachino et al. |
| 2007/0268737 A1* | 11/2007 | Hidaka .................. G11C 11/16 365/148 |
| 2008/0084735 A1* | 4/2008 | Parkinson .......... G11C 13/0004 365/163 |
| 2009/0235171 A1 | 9/2009 | Adams et al. |
| 2010/0220517 A1* | 9/2010 | Okayama ................. G11C 7/20 365/158 |
| 2011/0267901 A1 | 11/2011 | Yang et al. |
| 2014/0268975 A1 | 9/2014 | Kitagawa et al. |
| 2015/0131368 A1 | 5/2015 | Adams et al. |
| 2015/0325313 A1 | 11/2015 | Badereddine et al. |
| 2015/0357030 A1* | 12/2015 | Iyer ....................... G11C 11/412 365/156 |

OTHER PUBLICATIONS

U.S. Appl. No. 15/372,581, filed Dec. 8, 2016 Allowed.

* cited by examiner

WRITE ASSIST FOR MEMORIES WITH RESISTIVE BIT LINES

CROSS-REFERENCE TO RELATED APPLICATIONS

This application is a continuation of U.S. application Ser. No. 15/372,581, filed Dec. 9, 2016, the entire contents of which are incorporated herein by reference.

TECHNICAL FIELD

The subject disclosure relates generally to memories, e.g., to write assist for memories with resistive bit lines.

BACKGROUND

Memory devices can comprise memory cells that can be used to store data (e.g., one or more bits of data). Many types of memory devices are fabricated using silicon (e.g., a semiconductor-based memory). A memory cell, such as, for example, a memory cell of a static random access memory (SRAM), can be associated with bit lines (e.g., a bit line and a complementary bit line) and a word line. When desired, a write operation can be performed on the memory cell and/or other memory cells of the memory device. As part of the write operation, to facilitate changing a state of the memory cell (e.g., to facilitate transitioning the memory cell between a "0" (or "low") state and a "1" (or "high") state), respective voltages can be applied to the bit lines and the word line, wherein the new state value can be based at least in part on (e.g., can correspond to) the voltage level applied to the bit lines.

As new process technology reduces silicon dimensions, memory density can increase, wire dimensions can decrease, and metal resistivity can increase, all of which can lead to writability issues of memory cells. Any type of memory bit cell write that requires jamming of a new state into the memory cell can be prone to scaling issues, and resistance of bit lines can be a significant contributor to such scaling issues. The conflict between the old state and the new state of the memory cell can result in current flow to the bit line associated with the memory cell until the new state is able to flip the memory cell (e.g., until the memory cell is transitioned to the new state). The resulting IR drop (e.g., resulting voltage drop across a resistor or resistance produced by the flow of current) in the bit line can reduce the drive strength of the new state; and successful write operation may be prevented if this IR drop is sufficiently high.

The above-described description is merely intended to provide a contextual overview of current memory systems and is not intended to be exhaustive.

SUMMARY

The following presents a simplified summary in order to provide a basic understanding of some aspects described herein. This summary is not an extensive overview of the disclosed subject matter. It is intended to neither identify key or critical elements of the disclosure nor delineate the scope thereof. Its sole purpose is to present some concepts in a simplified form as a prelude to the more detailed description that is presented later.

With regard to memory systems and devices, as memory density increases, wire dimensions can decrease, and metal resistivity can increase, all of which can lead to writability issues for memory cells. Bit line resistance can be a significant problem that has to be dealt with when trying to increase memory density. Some conventional systems, methods, and techniques for addressing these issues with regard to writing data to memory can be inefficient, for example, with regard to the size of the cell area needed and/or the amount power consumed to overcome the writability issues, and/or can be increasingly less efficient as memory is scaled to increase memory density. In an effort to overcome these and other deficiencies, in an example embodiment, disclosed herein is a memory system that contains a set of memory cells associated with a bit line, wherein the bit line is associated with a first current path to a ground or to a power supply component. The memory system also can contain a write assist component that is associated with the bit line and creates at least one additional current path to the ground or the power supply component to facilitate mitigation of an effect of a resistance associated with the bit line during a write operation associated with a memory cell of the set of memory cells.

In another example embodiment, disclosed herein is a method for writing data to a memory that comprises associating a set of memory cells with a bit line of the memory, the bit line being associated with a first current path to a ground or a power supply. The method also can comprise, during a write operation on a memory cell of the set of memory cells, forming at least one additional current path to the ground or the power supply to facilitate mitigating an effect of a resistance associated with the bit line to facilitate performing the write operation on the memory cell.

In yet another example embodiment, disclosed herein is a device comprising a set of memory cells of a memory, the set of memory cells being associated with a bit line of a set of bit lines of the memory, and the bit line being associated with a current path to a ground or to a power supply component. The device also can contain a set of word lines of the memory, respective word lines of the set of word lines being associated with respective memory cells of the set of memory cells. The device further can contain a voltage component that applies a write voltage to a memory cell of the set of memory cells during a write operation to write data to the memory cell. The device also can comprise a write assist component that, during the write operation, creates at least one additional current path to the ground or the power supply component to facilitate controlling a resistance associated with the bit line to facilitate the writing of the data to the memory cell, the voltage component being associated with the bit line at a first end of the bit line and the write assist component being associated with the bit line at or within a defined distance of a second end of the bit line that is opposite of the first end of the bit line.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
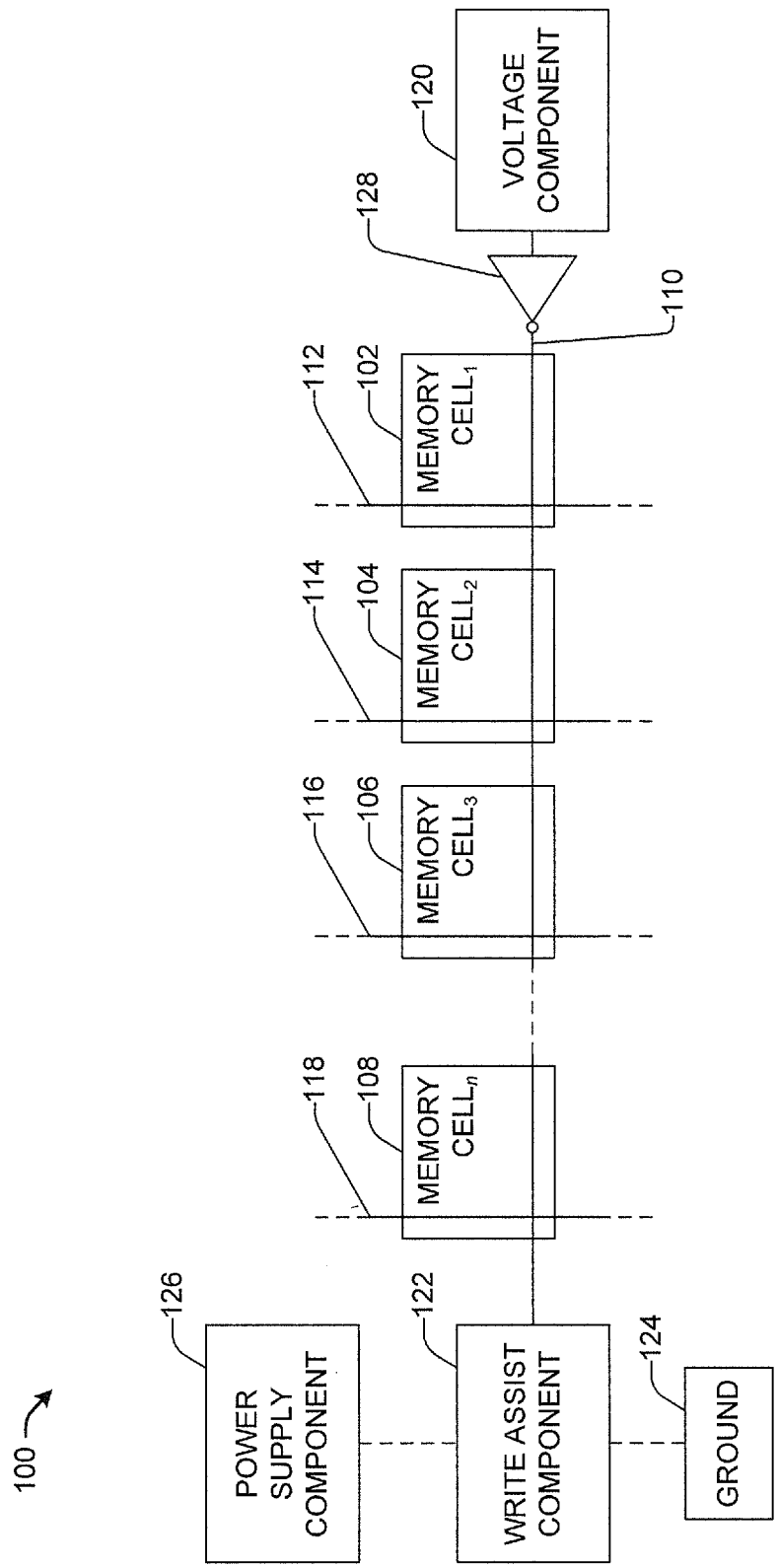
FIG. 1 illustrates a block diagram of an example, non-limiting system that can employ write assists to efficiently perform write operations in a memory, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

As new process technology reduces silicon dimensions of memory, memory density can increase, wire dimensions can decrease, and metal resistivity can increase, all of which can lead to writability issues of memory bit cells. Any type of memory bit cell write that requires jamming of a new state into the memory cell can be prone to scaling issues, and resistance of bit lines can be a significant contributor to such scaling issues. The conflict between the old state and the new state of the memory cell can result in current flow to the bit line associated with the memory cell until the new state is able to flip the memory cell (e.g., until the memory cell is transitioned to the new state). The resulting IR drop (e.g., resulting voltage drop across a resistor or resistance produced by the flow of current) in the bit line can reduce the drive strength of the new state; and successful write operation may be prevented if this IR drop is sufficiently high.

Figure 17:
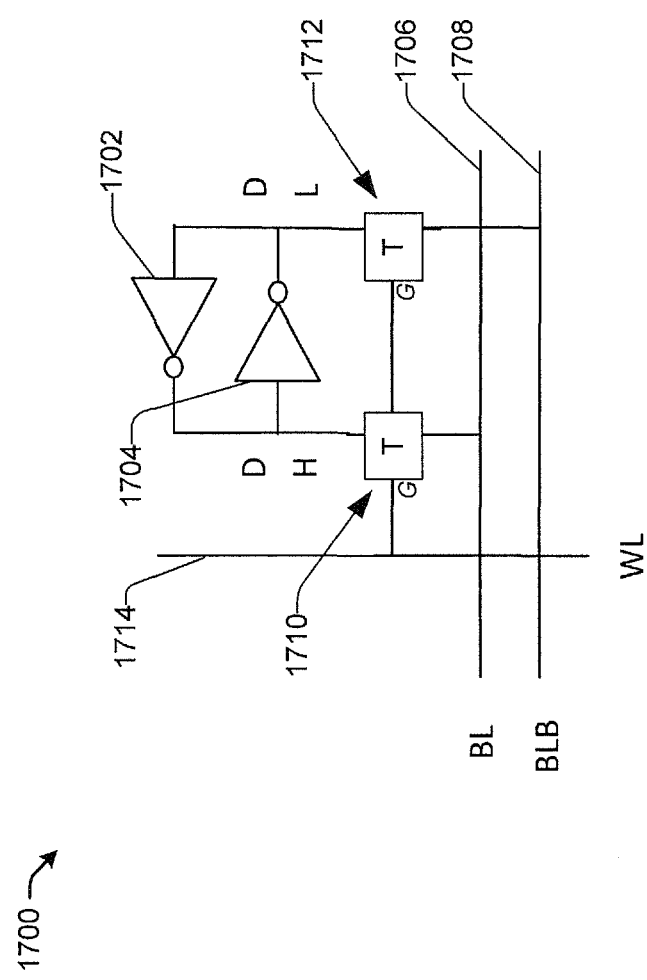
FIG. 17 illustrates a diagram of an example memory cell, which can be a six transistor (6T) static random access memory (SRAM) cell.
Figure 18:
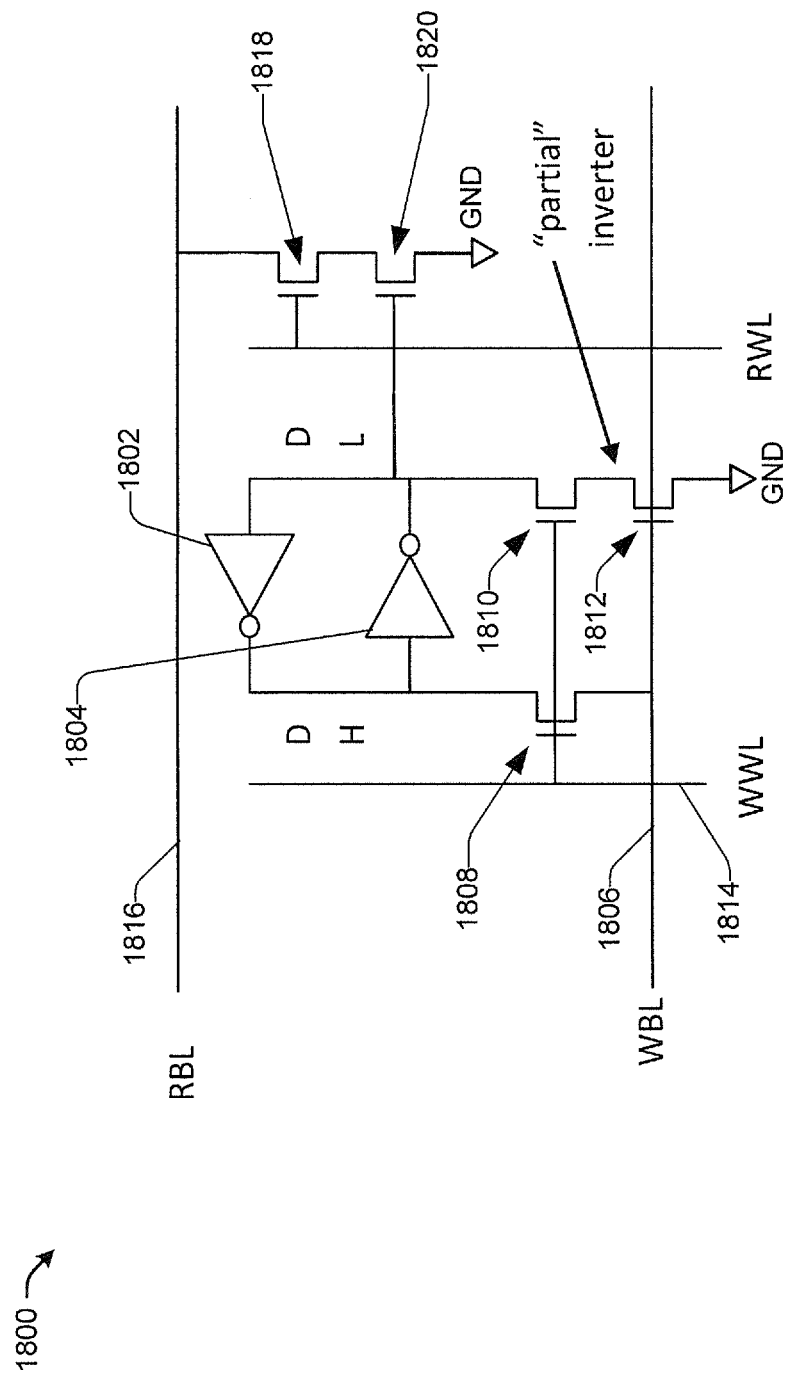
FIG. 18 depicts a diagram of an example memory cell that can employ single-ended read and write bit lines.

By way of example, FIGS. 17 and 18 describe some common memory design configurations for which there can be a writability issue. However, it is to be appreciated and understood that this writability issue is not limited to these memory cells with such memory design configurations, but such example memory cells are merely presented to illustrate these common cases where the writability issue can arise to facilitate discussion of the writability issue and description of various aspects and embodiments of the disclosed subject matter.

Referring briefly to FIG. 17, FIG. 17 illustrates a diagram of an example memory cell 1700, which can be a six transistor (6T) static random access memory (SRAM) cell. The memory cell 1700 can comprise a first inverter 1702 and a second inverter 1704 (e.g., cross-coupled inverters) that can be cross-connected to each other to form a latch. The first inverter 1702 and the second inverter 1704 each can comprise and can be formed using two transistors (not shown).

The memory cell 1700 (e.g., 6T SRAM cell) can use differential bit lines which can show how pass transistors can be used to write data to the memory cell 1700. The latch formed by the first inverter 1702 and the second inverter 1704 can be respectively connected to complementary bit lines comprising a first bit line 1706 (BL) and a second bit line 1708 (BLB) via a first transistor (T) 1710 and a second transistor 1712, respectively, as depicted in FIG. 17. The transistors of the first inverter 1702 and second inverter 1704 of the memory cell 1700 can be metal-oxide-semiconductor field-effect transistors (MOSFETs), such as complementary MOSFETs (also referred to as CMOSFETs or CMOSs), which can comprise both n-channel MOSFETS (also referred to herein as NMOSFETS, NMOSs, or nfets) and p-channel MOSFETS (also referred to herein as PMOS-FETS, PMOSs, or pfets).

In some implementations, the first transistor 1710 and the second transistor 1712 can be NMOSs. During a write operation associated with the memory cell 1700, the NMOS transistors (e.g., NMOS pass gates) can facilitate pulling a "1" (or "high") data state (e.g., $V_{DD}$) to a "0" (or "low") data state (e.g., $V_{SS}$). In other implementations, the first transistor 1710 and the second transistor 1712 can be PMOSs. In the PMOS write-circuit configuration, during a write operation associated with the memory cell 1700, the PMOS transistors (e.g., PMOS pass gates) can facilitate pulling a "0" (or "low") data state (e.g., $V_{SS}$) to a "1" (or "high") data state (e.g., $V_{DD}$).

The gates of the first transistor 1710 and the second transistor 1712 can be associated with (e.g., connected to) a word line 1714. In the NMOS write-circuit configuration, when the word line 1714 is at low (e.g., ground) or "0" level, the word line 1714 can be in the de-activated state, and the first transistor 1710 and the second transistor 1712 can be turned off (e.g., can be in an off state) and the latch can retain its current state (e.g., data state). When the word line 1714 is at a high or "1" level, the word line 1714 can be in the activated state, and the first transistor 1710 and the second transistor 1712 can be turned on (e.g., can be in an on state) to facilitate performing a write operation on the memory cell 1700.

In the PMOS write-circuit configuration, when the word line 1714 is at a high or "1" level, the word line 1714 can be in the de-activated state, and the first transistor 1710 and the second transistor 1712 can be turned off (e.g., can be in an off state) and the latch can retain its current state (e.g., data state). When the word line 1714 is at a low or "0" level, the word line 1714 can be in the activated state, and the first transistor 1710 and the second transistor 1712 can be turned on (e.g., can be in an on state) to facilitate performing a write operation on the memory cell 1700.

Since complementary bit lines (e.g., 1706, 1708) are used, the write operations for the memory cell 1700 can be symmetrical (e.g., writing a "0" or "1" data value to the memory cell 1700 can always be a "push-pull" write to the two sides of the memory latch which can give equal write delay regardless of the data polarity being written). A driver (e.g., write driver) can be associated with (e.g., connected to) ends of the first bit line 1706 and second bit line 1708. During a write operation, the driver can apply a desired write voltage, which can correspond to the data value that is to be stored in the memory cell 1700, to the end of the first bit line 1706, a complementary voltage to the second bit line 1708, and a desired (e.g., appropriate) word line voltage can be applied to the word line 1714 to facilitate activating the word line 1714 to facilitate performing the write operation on the memory cell 1700. Application of the desired write voltage by the driver to the first bit line 1706 and a complementary voltage to the second bit line 1708 can facilitate transitioning (e.g., force the transition) of the memory cell 1700 into the desired data state. The word line 1714 can be de-activated (e.g., by removing or discontinuing the word line voltage from or on the word line 1714), wherein the memory cell 1700 can be maintained in the desired data state after the word line 1714 is de-activated.

Turning briefly to FIG. 18, FIG. 18 depicts a diagram of an example memory cell 1800, which can comprise memory using single-ended read and write bit lines with a variant of such memory cell 1800 that can add an nfet to one of the pass gates that can thereby result in an nfet stack to ground (GND). The memory cell 1800 can comprise a first inverter 1802 and a second inverter 1804 that can be cross-connected to each other to form a latch.

The memory cell 1800 can add an nfet to one of the pass gates resulting in an nfet stack to ground. For instance, the latch formed by the first inverter 1802 and second inverter 1804 can be associated with (e.g., connected to) the write bit line 1806 (WBL) via a first transistor 1808 and via the transistor stack (e.g., nfet stack) to ground, wherein the transistor stack can comprise a second transistor 1810 and a third transistor 1812, and wherein the gate of the third transistor 1812 can be connected to the write bit line 1806. The gates of the first transistor 1808 and the second transistor 1810 can be associated with (e.g., connected to) a write word line 1814. When the write word line 1814 is at ground level, the first transistor 1808 and the second transistor 1810 can be turned off (e.g., can be in an off state) and the latch can retain its current state (e.g., data state). During a write operation, when the write word line 1814 is activated (e.g., by applying a desired voltage to the write word line 1814), the transistor stack to ground can form a "partial inverter," as, for example, it can drive the pass transistor with an inverted copy of the write bit line 1806 when the write bit line 1806 is writing a "1" data value to the memory cell 1800, wherein, however, there will be no drive when writing a "0" data value to the memory cell 1800.

The memory cell 1800 also can comprise a read bit line 1816 associated with the memory latch via a fourth transistor 1818 and a sixth transistor 1820, which can be associated with the ground.

With further regard to FIG. 17, writing to this memory cell 1700 can essentially be determined by the bit line that is at the "0" level. This is because, during a read operation, the memory cell 1700 is read by turning on the pass transistors with both bit lines 1706 and 1708 set at the "1" level. The "0" side of the memory latch can be sensed when it pulls down its bit line via the pass transistor sufficiently to be detected. The bit line must not pull up the "0" side of the memory latch in an unintended write operation, so by design, a "1" on the bit line has very little effect on the memory state of the memory cell 1700. As a result, the "0" level bit line is used initiate the cell write.

Considering a write operation to write a data value to the memory cell 1700 when DH="1" and BL="0". The DH side of the memory latch (e.g., formed by the first inverter 1702 and second inverter 1704) has to be pulled low enough to reach the switch threshold of the DL driver in order to switch its output to a "1" value. The actual value of the voltage at DH can be determined by a voltage divider between VDD and VSS comprising of:
  1. a memory cell pfet in the DH driver in the memory cell;
  2. a memory cell pass transistor in the memory cell connecting bit line;
  3. bit line resistance (which can grow non-linearly with new technology and reductions in dimensions of the memory); and
  4. a bit line driver nfet (this can usually be ignored when there is a large driver).

While the problem of writing a "0" has been described for the memory cell 1700 (e.g., 6T memory cell), it also can be found in other cell types, such as, for example, cell designs using single ended bit lines (e.g., memory cell 1800) or even separate bit lines for reading or writing. Only memory cells that are completely gate coupled to the bit lines can be nearly insensitive to bit line resistance. However, those memory cells are relatively larger and not as economical as memory cells like the 6T memory cell and memory cells with cell designs using single ended bit lines or even separate bit lines for reading or writing.

The components (e.g., devices) used in a memory cell, such as the memory cell 1700, the memory cell 1800, and other similarly designed memory cells, can be relatively small in order to achieve desirable area efficiency, and can suffer from large process variation. All of that coupled with a wide range of power supply voltage and temperature specifications (e.g., requirements) can lead to a large variation in threshold for the memory cells. The design problem can be exacerbated by advanced technology that may quantize device sizes and often can lead to unfavorable ratios of small devices. All of these design issues can lead to significant degradation upon every process technology advancement. Further, the bit line resistance contribution against memory cell writability can increase in a non-linear fashion, which can become a dominant issue with memory cell writability.

One conventional technique to reduce bit line resistance associated with memory cells in a memory can be achieved by using very wide bit lines to facilitate controlling or reducing resistance. However, using very wide bit lines can come at the expense of bit cell area, as bit cell area is increased when using very wide bit lines. Another conventional technique to reduce bit line resistance can be to add more repeaters to shorten the bit line at the expense of data-path area. Both of these conventional techniques can be undesirable though and can lead to significant loss of efficiency in the memory design.

There also are certain conventional write assist techniques that can include negative bias bit lines, which have been shown to somewhat improve cell writability at the expense of an area and power overhead. However, as newer technology processes further reduce dimensions of memory devices and bit line resistance becomes a more dominant effect, the use of such certain conventional write assist techniques can become a much less viable and less desirable option as it effectively can boost the voltage use for bit-cell write as opposed to directly addressing the wire resistance of the bit line. Further, as the bit line resistance increases, the overhead in both area and power for these conventional write assist techniques to remain effective undesirably increases resulting in loss of efficiency in memory design.

To overcome these and various other inefficiencies of conventional memories, techniques for efficiently assisting in performing write operations in memories with resistive bit lines are presented. A memory can comprise a set of memory cells, wherein memory cells can be associated with respective word lines and bit lines. With regard to respective bit lines of the memory, a write assist component can be associated with a subset of the set of memory cells associated with a bit line. The configuration of the write assist component can be based at least in part on the type of transistors (e.g., NMOSs, PMOSs) employed for the write circuits of the memory cells of the subset of memory cells. During a write operation, the write assist component can facilitate adding an additional current path to the ground, or the power supply, or both, at the far end of the write bit line when an appropriate write polarity is applied to the bit line by the driver at the other end of the bit line. This can reduce the effective resistance of the bit line, which can reduce IR loss of the write signal.

These and other aspects and implementations of the disclosed subject matter will now be further described in connection with the figures.

FIG. 1 illustrates a block diagram of an example, non-limiting system 100 that can employ write assists to efficiently perform write operations in a memory, in accordance with various aspects and embodiments of the disclosed subject matter. The system 100 can be or can be part of a memory (e.g., a memory device comprising the memory), for example.

The system 100 can comprise a set of memory cells, comprising memory cell$_1$ 102, memory cell$_2$ 104, memory cell$_3$ 106, up through memory cell$_n$ 108, wherein n can be virtually any desired integer number. The set of memory cells (e.g., 102, 104, 106, 108, . . . ) can comprise, for example, memory cells that can use pass transistor logic, use complementary or differential bit lines, and/or use single ended read and write bit lines. For example, the set of memory cells (e.g., 102, 104, 106, 108, . . . ) can comprise SRAM cells. In accordance with various implementations and embodiments, the set of memory cells (e.g., 102, 104, 106, 108, . . . ) can comprise transistors, including MOSFETs, such as CMOSs, which can comprise both nfets and pfets. It is to be appreciated and understood that other types of memory cells can be employed in memory of the system 100, in accordance with various aspects and embodiments of the disclosed subject matter. The memory, comprising the set of memory cells (e.g., 102, 104, 106, 108, . . . ), can comprise volatile memory (e.g., volatile memory cells) or non-volatile memory (e.g., non-volatile memory cells).

The set of memory cells (e.g., 102, 104, 106, 108, . . . ) can be associated with (e.g., connected to) a bit line 110 (e.g., a write bit line) that can facilitate writing data (e.g., one or more bits of data having data values, such as a "0" or a "1") to respective memory cells (e.g., 102, 104, 106, 108, . . . ) of the set of memory cells when the respective memory cells are selected for a write operation. The respective memory cells (e.g., 102, 104, 106, 108, . . . ) of the set of memory cells can be associated with (e.g., connected to) respective word lines of a set of word lines, comprising word line$_1$ 112, word line$_2$ 114, word line$_3$ 116, up through word line$_n$ 118. During a write operation, a desired voltage level from a voltage source (not shown in FIG. 1) can be applied to a desired word line (e.g., word line$_n$ 118) to activate the word line to facilitate writing a data value to the desired memory cell (e.g., memory cell$_n$ 108) associated with the desired word line, wherein the data value can be based at least in part on a voltage level (e.g., a write voltage) applied to the bit line 110 associated with the desired memory cell.

For brevity and clarity, with regard to the system 100, only one bit line (e.g., bit line 110), one set of memory cells (e.g., 102, 104, 106, 108, . . . ), and one set of word lines (e.g., 112, 114, 116, 118, . . . ) are shown. It is to be appreciated and understood that the system can comprise one or more additional sets of memory cells that can be respectively associated with one or more additional bit lines and respective word lines of the set of word lines.

The system 100 can comprise a voltage component 120 (e.g., voltage driver or bit line driver) that, during a write operation, can apply a particular voltage level to the bit line 110 to facilitate storing a particular data value, which can correspond to the particular voltage level, in a memory cell(s) (e.g., 102, 104, 106, or 108) that has been activated for the write operation (e.g., by applying a specified voltage to the write line(s) associated with the memory cell(s)). For instance, the particular voltage level can be a first voltage level that can correspond to a first data value (e.g., "0" or "low" data value) or a second voltage level that can correspond to a second data value (e.g., "1" or "high" data value).

Writability of memory cells generally can be more problematic at the end of a long bit line that is furthest away from the voltage component (e.g., bit line driver) at the other end of the bit line due to the entire bit line resistance that can contribute to the IR loss with respect to the bit line. The writability can increasingly improve for each memory cell closer to the voltage source at the other end of the bit line because the bit line resistance can decrease linearly with distance between the voltage source and the memory cell being written. With regard to 6T SRAM cells (e.g., of FIG. 17), memory cells with single-ended read and write bit lines (e.g., of FIG. 18), and certain other types of memory cells, the bit line resistance can be most significant (e.g., potentially can most negatively impact a write operation) for the bit line writing a "0" or "low" data value to a memory cell that is associated with the bit line via an NMOS write-circuit configuration as the bit line must initiate the write operation.

The system 100 can comprise a write assist component 122 that can be associated with (e.g., connected to) the bit line 110. For instance, the write assist component 122 can be associated with (e.g., connected to and located at) the end of the bit line 110 that is at the opposite end from the end of the bit line 110 where the voltage component 120 is located. By being associated with the bit line 110, the write assist component 122 also can be associated with the set of memory cells (e.g., 102, 104, 106, 108, . . . ) associated with the bit line 110.

During a write operation to write to a memory cell (e.g., memory cell$_n$ 108) associated with the bit line 110, the write assist component 122 can be configured to facilitate adding an additional current path to the ground 124 (which can have or be associated with a voltage level of $V_{gnd}$ or $V_{SS}$), or the power supply component 126, or both, at the far end of the bit line 110 (e.g., at the end of the write bit line 110 where the write assist component 122 is located) when an appropriate write polarity is applied to the bit line 110 by the voltage component 120 at the other end of the bit line 110. For example, when the memory cells are associated with NMOSs in the write circuit (e.g., when the pass transistors for the write circuit are NMOSs), the write assist component 122 can comprise an NMOS (as more fully disclosed herein), and the appropriate write polarity can be a "0" or "low" voltage level applied to the bit line 110. For instance, on or along the bit line 110, the write assist component 122 can be situated (e.g., positioned) in the circuit of the system 100 such that the write assist component 122 can be closer in proximity to the memory cell (e.g., memory cell$_n$ 108) that is furthest from the voltage component 120 (e.g., the write data driver) than the proximity of the write assist component 122 to the voltage component 120 along the bit line 110. For example, in some implementations, the write assist component 122 can be positioned along the bit line 110 after the last memory cell (e.g., memory cell$_n$ 108) such that the write assist component 122 is further away from the voltage component 120 than the last memory cell (e.g., memory cell$_n$ 108) is (e.g., as depicted in FIG. 1). In other implementations, the write assist component 122 can be positioned along the bit line 110 before the last memory cell (e.g., between memory cell$_n$ 108 and memory cell$_{n-1}$ along the bit line 110) and/or before another memory cell(s) (e.g., between memory cell$_{n-1}$ and memory cell$_{n-2}$ along the bit line 110) such that the write assist component 122 is closer to the voltage component 120 than the last memory cell (e.g., memory cell$_n$ 108) and/or the other memory cell(s) (e.g., memory cell$_3$ 106) is.

If the write circuits of the set of memory cells (e.g., 102, 104, 106, 108, . . . ) employ NMOS transistors, during a write operation to write a "0" or "low" data value to a memory cell (e.g., memory cell$_n$ 108) associated with the bit line 110 (e.g., when the memory cell currently has a "1" or "high" data value stored therein), the voltage component 120 can apply a desired low voltage to the bit line 110 (e.g., a desired low voltage output from an inverter 128 between the voltage component 120 and the bit line 110 at the output of the inverter 128), wherein the desired low voltage can correspond to the "0" or "low" data value. A desired voltage level (e.g., word line activation voltage) can be applied to the word line (e.g., word line$_n$ 118) associated with the memory cell (e.g., memory cell$_n$ 108) to activate the word line to facilitate performing the write operation. The desired low voltage applied to the bit line 110 also can be applied to the write assist component 122. In response to receiving the desired low voltage, the write assist component 122 can create or add an additional current path to the ground 124 at (or near) the far end of the bit line 110 in proximity to where the write assist component 122 is located (e.g., by turning on a transistor associated with the bit line 110 and the ground 124). This write assist (e.g., by adding the additional current path to the ground 124) by the write assist component 122 can control or mitigate (e.g., mitigate the effects of) the effective resistance of the bit line 110, which can control or mitigate (e.g., mitigate the effects of) IR loss of the write signal being applied to the bit line 110 and can facilitate enabling (e.g., efficiently enabling) the voltage component 120 to apply the desired write voltage level to the memory cell (e.g., memory cell$_n$ 108) to write the desired data value (e.g., "0" or "low" data value) to the memory cell. That is, the write assist can make the effective resistance of the bit line 110 lower than it otherwise would have been without the write assist being employed, and can thereby mitigate or reduce IR loss of the write signal being applied to the bit line 110 as compared to what the IR loss otherwise would have been without the write assist being employed.

If the write circuits of the set of memory cells (e.g., 102, 104, 106, 108, . . . ) employ PMOS transistors, during a write operation to write a "1" or "high" data value to a memory cell (e.g., memory cell$_n$ 108) associated with the bit line 110 (e.g., when the memory cell currently has a "0" or "low" data value stored therein), the voltage component 120 can apply a desired (e.g., defined) high voltage to the bit line 110 (e.g., a desired high voltage output from the inverter 128 between the voltage component 120 and the bit line 110 at the output of the inverter 128), wherein the desired high voltage can correspond to the "1" or "high" data value. A desired voltage level (e.g., word line activation voltage) can be applied to the word line (e.g., word line$_n$ 118) associated with the memory cell (e.g., memory cell$_n$ 108) to activate the word line to facilitate performing the write operation. The desired high voltage applied to the bit line 110 also can be applied to the write assist component 122. In response to receiving the desired high voltage, the write assist component 122 can create or add an additional current path to the power supply component 126 at (or near) the far end of the bit line 110 in proximity to where the write assist component 122 is located (e.g., by turning on a transistor associated with the bit line 110 and the power supply component 126). This write assist (e.g., by adding the additional current path to the power supply component 126) by the write assist component 122 can control or mitigate the effective resistance of the bit line 110, which can control or mitigate (e.g., mitigate the effects of) IR loss of the write signal being applied to the bit line 110 and can facilitate enabling (e.g., efficiently enabling) the voltage component 120 to apply the desired write voltage level to the memory cell (e.g., memory cell$_n$ 108) to write the desired data value (e.g., "1" or "high" data value) to the memory cell. That is, the write assist can make the effective resistance of the bit line 110 lower than it otherwise would have been without the write assist being employed, and can thereby reduce IR loss of the write signal being applied to the bit line 110 as compared to what the IR loss otherwise would have been without the write assist being employed.

The configuration of the write assist component 122 can be based at least in part on the type of transistors (e.g., NMOSs or nfets, PMOSs or pfets) employed in the write circuits associated with the set of memory cells (e.g., 102, 104, 106, 108, . . . ). For example, a first type of write assist component can be employed by the system 100 when the transistors (e.g. pass transistors) of the write circuits associated with the set of memory cells (e.g., 102, 104, 106, 108, . . . ) are NMOSs, a second type of write assist component can be employed by the system 100 when the transistors (e.g. pass transistors) of the write circuits associated with the set of memory cells are PMOSs, and a third type of write assist component can be employed by the system 100 when the transistors (e.g. pass transistors) of the write circuits associated with the set of memory cells are either NMOSs or PMOSs. As desired, in some implementations, the third type of write assist component alternatively can be employed by the system 100 when the transistors of the write circuits associated with the set of memory cells are CMOSs, although the use of CMOSs in the write circuits is not a typical case.

The systems, including the system 100, methods, and techniques disclosed herein, comprising the use of write assist components, can improve writability of the memory without modifying the affected memory cells of the memory. The systems, methods, and techniques disclosed herein, can mitigate higher bit line resistance by switching an active termination at the end of a bit line based at least in part on a state of the bit line. The write assist component can utilize a relatively small area and can have relatively small power overhead (e.g., can be low in power consumption), and the control timing for operation of the write assist component is not complex. The systems, methods, and techniques disclosed herein, can desirably facilitate porting memory designs to a newer process technology that can exhibit intrinsically higher metal resistivity and/or sheet resistance.

Figure 2:
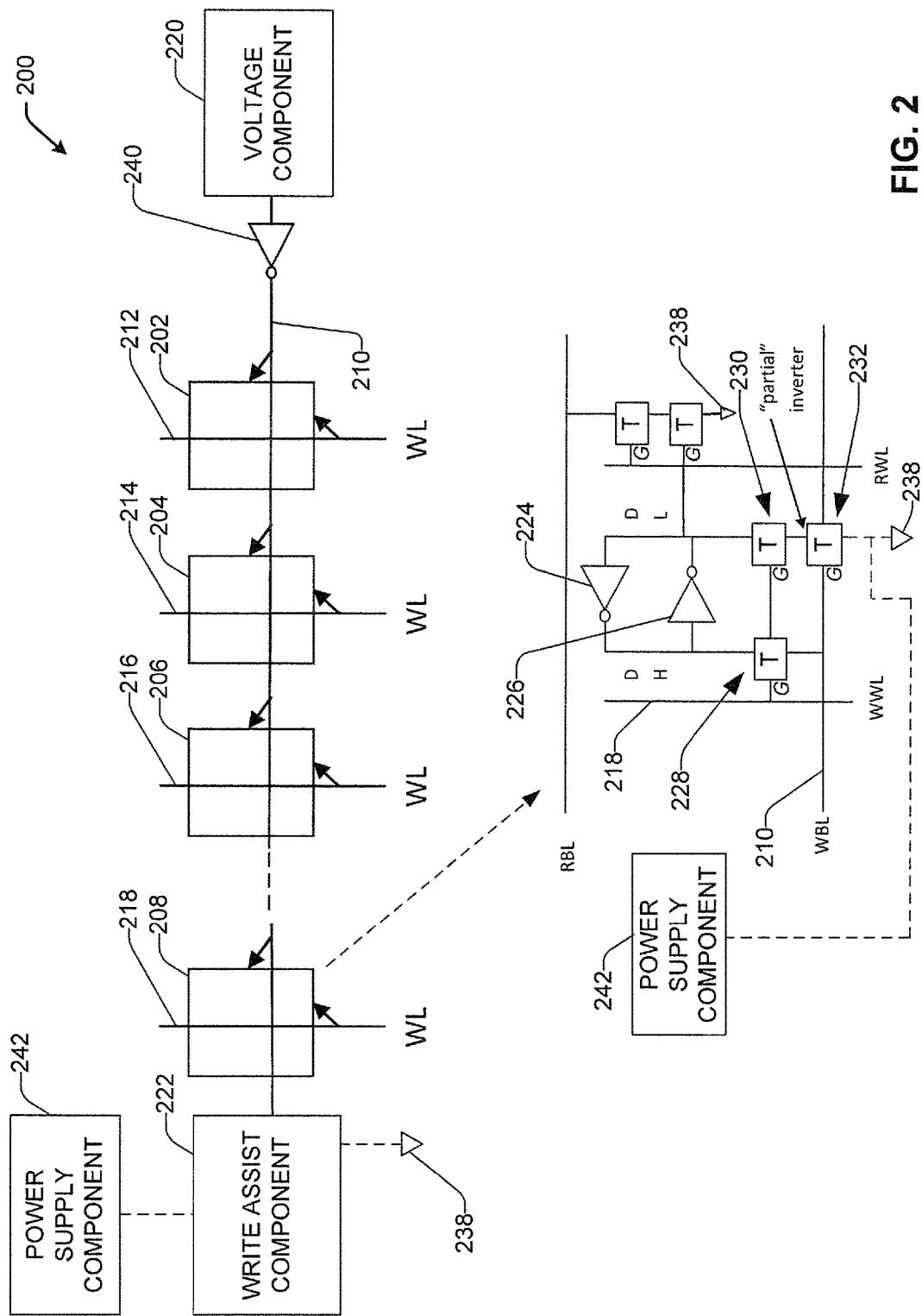
FIG. 2 depict a diagram of an example, non-limiting system that can employ write assists to efficiently perform write operations in a memory, in accordance with various aspects and embodiments of the disclosed subject matter.

Referring to FIG. 2, depicted is a diagram of an example, non-limiting system 200 that can employ write assists to efficiently perform write operations in a memory, in accordance with various aspects and embodiments of the disclosed subject matter. The system 200 can be or can be part of a memory, for example.

The system 200 can comprise a set of memory cells, comprising memory cell$_1$ 202, memory cell$_2$ 204, memory cell$_3$ 206, up through memory cell$_n$ 208, wherein n can be virtually any desired integer number. The set of memory cells (e.g., 202, 204, 206, 208, . . . ) can comprise, for example, memory cells that can use pass transistor logic, use complementary or differential bit lines, and/or use single ended read and write bit lines. In some implementations, the set of memory cells (e.g., 202, 204, 206, 208, . . . ) can comprise SRAM cells. It is to be appreciated and understood that other types of memory cells can be employed in memory of the system 200, in accordance with various aspects and embodiments of the disclosed subject matter. The memory, comprising the set of memory cells (e.g., 202, 204, 206, 208, . . . ), can comprise volatile memory or non-volatile memory.

The set of memory cells (e.g., 202, 204, 206, 208, . . . ) can be associated with (e.g., connected to) a bit line 210 that can facilitate writing data (e.g., one or more bits of data having data values, such as a "0" or "low", or a "1" or "high") to respective memory cells (e.g., 202, 204, 206, 208, . . . ) of the set of memory cells when one or more of the respective memory cells are selected for a write operation. The respective memory cells (e.g., 202, 204, 206, 208, . . . ) of the set of memory cells can be associated with (e.g., connected to) respective word lines of a set of word lines, comprising word line$_1$ 212, word line$_2$ 214, word line$_3$ 216, up through word line$_n$ 218. During a write operation, a desired voltage level from a voltage source (not shown in FIG. 2) can be applied to a desired word line (e.g., word line$_n$ 218) to activate the word line to facilitate writing a data value being applied to the bit line 210 to the desired memory cell (e.g., memory cell$_n$ 208) associated with the desired word line$_n$, wherein the data value can be based at least in part on a voltage level (e.g., the write voltage) applied to the bit line 210 associated with the desired memory cell.

It is to be appreciated and understood that, for reasons of brevity and clarity, in the system 200, only one bit line (e.g., bit line 210), one set of memory cells (e.g., 202, 204, 206, 208, . . . ), and one set of word lines (e.g., 212, 214, 216, 218, . . . ) are depicted. It is to be appreciated and understood that the system 200 can comprise one or more additional sets of memory cells that can be respectively associated with one or more additional bit lines and respective word lines of the set of word lines.

The system 200 can comprise a voltage component 220 that, during a write operation, can apply a particular voltage level (e.g., a particular write voltage) to the bit line 210 to facilitate storing a particular data value, which can correspond to the particular voltage level, in a memory cell(s) (e.g., 202, 204, 206, 208, . . . ) that has been activated for the write operation (e.g., by applying a specified voltage to the write line(s) associated with the memory cell(s)). For instance, the particular voltage level can be a first voltage level that can correspond to a first data value (e.g., "0" or "low" data value) or a second voltage level that can correspond to a second data value (e.g., "1" or "high" data value).

Bit line resistance in the bit line 210 can present a potential writability problem during certain write operations to certain memory cells (e.g., memory cell$_n$ 208), such as memory cells at the other end of the bit line 210 that is opposite to the end of the bit line 210 where the voltage component 220 can be located. With regard to a write circuit that is associated with a memory cell and employs NMOSs, the bit line resistance in the write bit line can be most significant (e.g., potentially can most negatively impact a write operation) with regard to the bit line applying a desired low voltage to the memory cell (e.g., memory cell$_n$ 208) to write a "0" or "low" data value to the memory cell when the memory cell has a "1" or "high" data value stored therein, as the bit line must initiate the write operation.

To facilitate overcoming potential writability problems, the system 200 can comprise a write assist component 222 that can be associated with (e.g., connected to) the bit line 210 at (or in relative proximity to (e.g., within a desired defined distance of)) the far end of the bit line 210 that is at the opposite end of the bit line 210 from the other end of the bit line 210 where the voltage component 220 is located. By being associated with the bit line 210, the write assist component 222 also can be associated with the set of memory cells (e.g., 202, 204, 206, 208, . . . ) associated with the bit line 210.

As the potential writability problems can be more likely to occur with regard to the memory cell$_n$ 208 (or one or more other memory cells) at (or near) the far end of the bit line 210 at or near the opposite end of the bit line 210 from the other end of the bit line 210 where the voltage component 220 is located, a write operation relating to the memory cell$_n$ 208 will be described herein to facilitate illustrating aspects and embodiments of the disclosed subject matter. The memory cell$_n$ 208 can be, for example, a memory cell that can employ a single write bit line, such as a memory cell that can be the same as or similar to the memory cell (e.g., 1800) as described with regard to FIG. 18, although it is to be appreciated and understood that the aspects and embodiments of the disclosed subject matter can be applied to other types of memory cells that employ a single write bit line (and, as further described herein, can be applied to other types of memory cells that employ complementary bit lines).

The memory cell$_n$ 208 can comprise a first inverter 224 and a second inverter 226 that can be cross-connected to each other to form a latch (e.g., a memory latch that can store a data value), wherein the first inverter 224 and the second inverter 226 can comprise CMOSs, for example. The write circuit associated with the memory cell$_n$ 208 can add a transistor (e.g., an NMOS for an NMOS write-circuit configuration; or a PMOS for a PMOS write-circuit configuration) to one of the pass gates, which can result in a transistor stack to ground for the NMOS write-circuit configuration or to a power supply component for the PMOS write-circuit configuration. For example, the latch formed by the first inverter 224 and second inverter 226 can be associated with (e.g., connected to) the bit line 210 (WBL) via a first transistor 228 and via the transistor stack to ground for the NMOS write-circuit configuration or to the power supply component for the PMOS write-circuit configuration, wherein the transistor stack can comprise a second transistor 230 and a third transistor 232, and wherein the gate (G) of the third transistor 232 can be connected to the bit line 210. The gates of the first transistor 228 and the second transistor 230 can be associated with (e.g., connected to) the word line$_n$ 218. When the word line$_n$ 218 is not activated (e.g., when the write circuit employs NMOSs and the word line$_n$ 218 is at ground level), the first transistor 228 and the second transistor 230 can be turned off (e.g., can be in an off state) and the latch can retain its current state (e.g., current data state). With regard to an NMOS write-circuit configuration, during a write operation, when the word line$_n$ 218 is activated (e.g., by applying a desired defined voltage level (e.g., a defined high level) to the word line$_n$ 218, when the write circuit employs NMOSs), the transistor stack to ground (for the NMOS write-circuit configuration) can form a "partial inverter," as, for example, it can drive the pass transistor with an inverted copy of the bit line 210 when the bit line 210 is writing a "1" or "high" data value to the memory cell$_n$ 208, wherein, however, there will be no drive when writing a "0" or "low" data value to the memory cell$_n$ 208.

Figure 3:
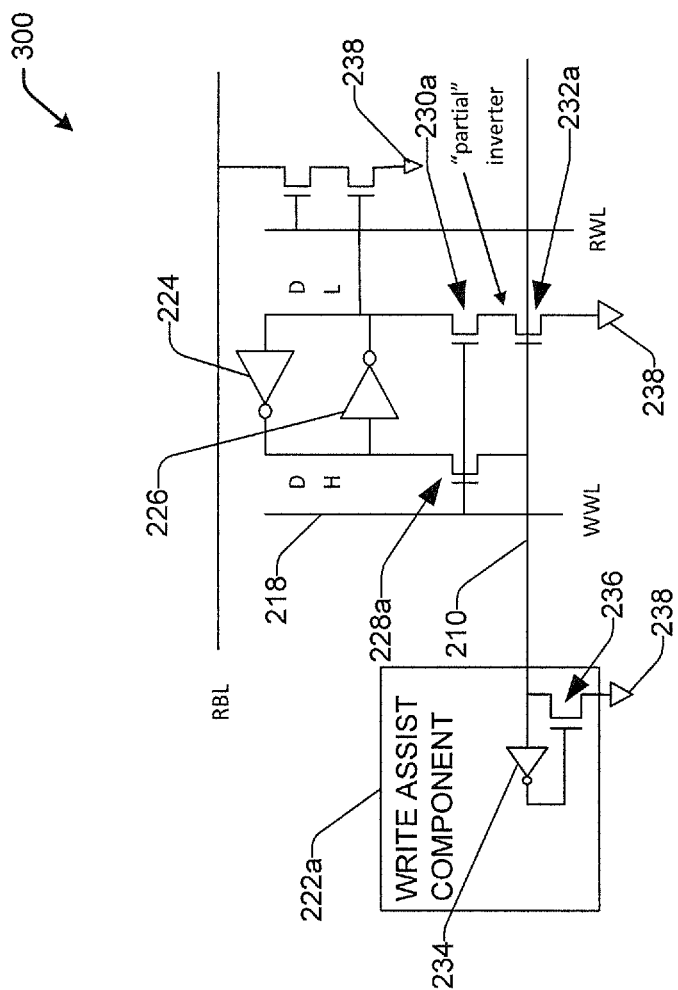
FIG. 3 illustrates a diagram of an example, non-limiting portion of a system that can employ write assists to efficiently perform write operations in a memory comprising memory cells that can be associated with write circuits that can employ n-channel metal-oxide-semiconductor field-effect transistors (NMOSs), in accordance with various aspects and embodiments of the disclosed subject matter.

Referring briefly to FIG. 3 (along with FIG. 2), FIG. 3 illustrates a diagram of an example, non-limiting portion 300 of the system 200 that can employ write assists to efficiently perform write operations in a memory comprising memory cells that can be associated with write circuits that can employ NMOSs, in accordance with various aspects and embodiments of the disclosed subject matter. In some embodiments, the set of memory cells (e.g., 202, 204, 206, 208, . . . ), including the memory cell$_n$ 208, can be associated with write circuits that can comprise transistors that can be NMOSs.

The non-limiting portion 300 of the system 200 can comprise the memory latch, which can comprise the first inverter 224 and the second inverter 226. The memory latch formed by the first inverter 224 and second inverter 226 can be associated with (e.g., connected to) the bit line 210 (WBL) via a first transistor 228a and via the transistor stack to ground, wherein the transistor stack can comprise a second transistor 230a and a third transistor 232a, and wherein the gate of the third transistor 232a can be connected to the bit line 210. The gates of the first transistor 228a and the second transistor 230a can be associated with (e.g., connected to) the word line$_n$ 218.

In such embodiments having an NMOS write-circuit configuration, the write assist component 222 can be or can comprise write assist component 222a. During a write operation to write to the memory cell$_n$ 208 (e.g., memory cell comprising NMOS transistors), the write assist component 222a can be configured to facilitate creating or adding an additional current path to the ground at (or relatively near) the far end of the bit line 210 (e.g., at (or relatively near) the end of the bit line 210 where the write assist component 222a is located) when an appropriate write polarity (e.g., a "0" or "low" voltage level, in the case of an NMOS write-circuit configuration) is applied to the bit line 210 by the voltage component 220 at the other end of the bit line 210. The additional current path can be provided by an nfet (e.g., NMOS) pull-down located at (or relatively near) the far end of the bit line 210 (e.g., write bit line) that can be switched on whenever a "0" or "low" value (e.g., a "0" or "low" voltage level) is driven onto the bit line 210 by the voltage component 220 (e.g., write bit line driver or write data driver).

For instance, the write assist component 222a can comprise an inverter 234 that can be associated with (e.g., connected to) the bit line 210 at the input (e.g., input port) of the inverter 234. The write assist component 222a also can comprise a transistor 236, which can be an NMOS, wherein the output (e.g., output port) of the inverter 234 can be connected to the gate of the transistor 236. The drain of the transistor 236 can be associated with (e.g., connected to) the bit line 210, and the source of the transistor 236 can be associated with (e.g., connected to) the ground 238. The circuit of the write assist component 222 can scale well over process migration, and the area and power overhead can be negligible. This technique of employing a write assist component 222 also can have the benefit of removing spatial voltage variation of the ground node between the voltage component 220 (e.g., write data driver) and the furthest memory cell (e.g., memory cell$_n$ 208) associated with the bit line 210.

During a write operation to write a "0" or "low" data value to the memory cell$_n$ 208 (e.g., when the memory cell$_n$ 208 currently has a "1" or "high" data value stored therein), the voltage component 220 can apply a desired (e.g., defined) low voltage to the bit line 210 (e.g., a desired low voltage that can be output from inverter 240, which can be situated between the voltage component 220 and the bit line 210 at the output of the inverter 240), wherein the desired low voltage can correspond to the "0" or "low" data value. A desired (e.g., defined) voltage level (e.g., a word line activation voltage) can be applied to the word line$_n$ 218 associated with the memory cell$_n$ 208 to activate the word line$_n$ 218 to facilitate performing the write operation to write the desired data value (e.g., a "0" or "low" data value) to the memory cell$_n$ 208. The desired low voltage applied to the bit line 210 also can be applied to the write assist component 222a located at the opposite end of the bit line 210. In response to receiving the desired low voltage from the bit line 210, the write assist component 222a can create or add an additional current path to the ground 238 at or near the far (e.g., opposite) end of the bit line 210 in proximity to where the write assist component 222a is located (e.g., by turning on the transistor 236 associated with the bit line 210 and the ground 238). For instance, the desired low voltage from the bit line 210 can be applied to the inverter 234, which can invert the signal to produce a desired high voltage level at the output. The high voltage level can be applied to the gate of the transistor 236, which can switch on the transistor 236 to open, create, or add the additional current path to the ground 238 at (or in relative proximity to) the far end of the bit line 210 (e.g., at (or relatively near) the end of the bit line 210 where the write assist component 222a is located).

This write assist (e.g., by adding the additional current path to the ground 238) by the write assist component 222a can control, mitigate, or reduce the effective resistance of the bit line 210 (e.g., relative to what the bit line resistance otherwise would have been if no write assist component 222a had been employed). This controlling, mitigation (e.g., mitigation of the effects), or reduction of the effective resistance of the bit line 210 can thereby control, mitigate, or reduce IR loss of the write signal (e.g., the desired low voltage corresponding to a "0" or "low" data value) being applied to the bit line 210 and can facilitate enabling (e.g., efficiently enabling) the voltage component 220 to apply the desired write voltage level to the memory cell$_n$ 208 to write the desired data value (e.g., "0" or "low" data value) to the memory cell$_n$ 208.

Figure 4:
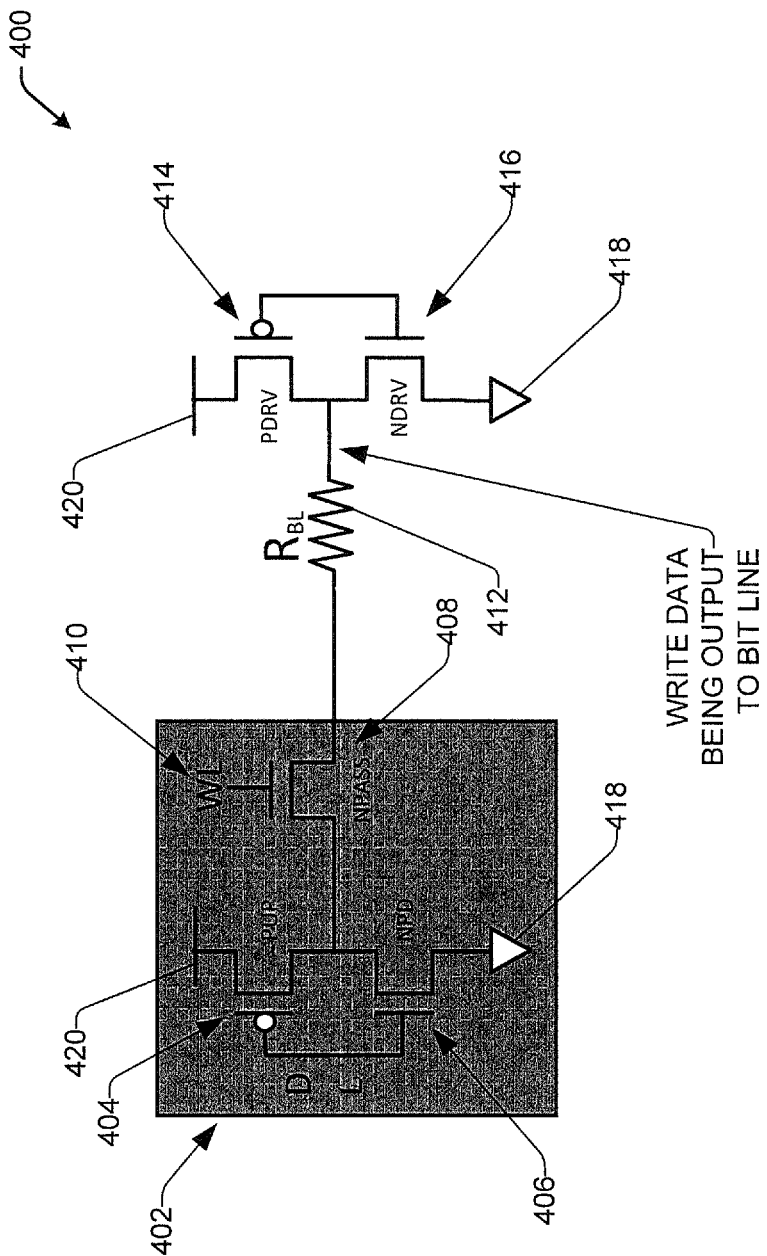
FIG. 4 presents an example, non-limiting memory write model without a write assist.
Figure 5:
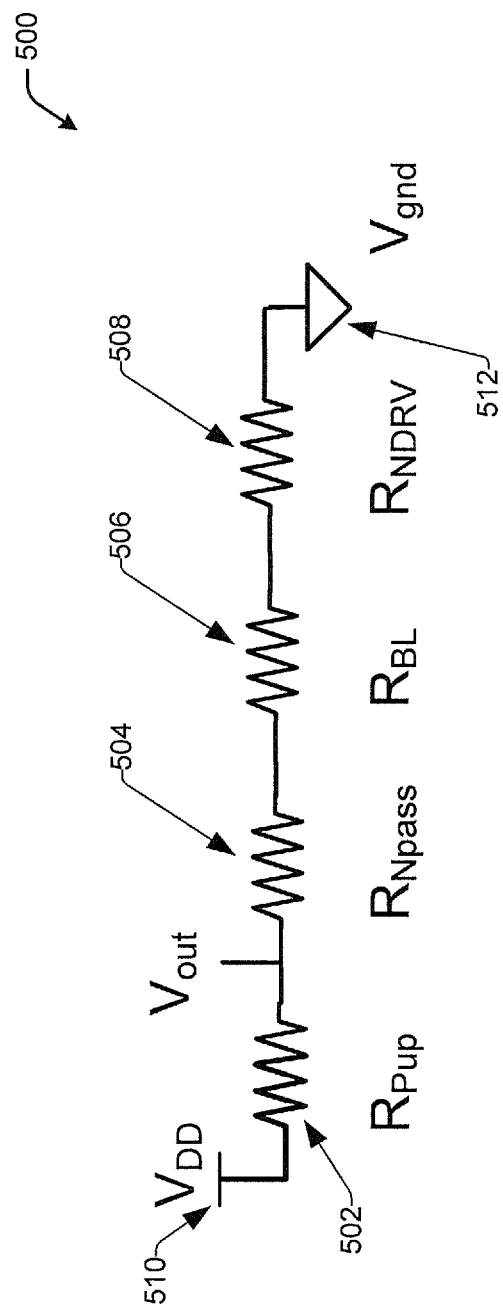
FIG. 5 illustrates an example, non-limiting resistance write model without a write assist.

Referring briefly to FIGS. 4 and 5 (along with FIG. 2 and FIG. 3), FIG. 4 presents an example, non-limiting memory write model 400 without a write assist. FIG. 5 illustrates an example, non-limiting resistance write model 500 without a write assist. The memory write model 400 can model a memory cell (e.g., 208) and other circuitry associated with the memory cell during a write operation without a write assist. The memory write model 400 can represent the design elements of the system 200, except without having the write assist functionality of the write assist component 222. The resistance write model 500 can comprise a resistor modeling of the active devices of the circuit of or associated with the memory cell (e.g., memory cell$_n$ 208), wherein the resistance write model 500 can effectively be a direct current (DC) model of the circuit of the memory write model 400.

The memory write model 400 can comprise memory cell portion 402 that can be a part of a memory cell (e.g., memory cell$_n$ 208) of the system 200 of FIG. 2. The memory cell portion 402 can include a PUP element 404 (e.g., PUP transistor), NPD element 406 (e.g., NPD transistor), and NPASS element 408 (e.g., NMOS pass transistor (NPASS transistor)), wherein the NPASS element 408 can be associated with a word line 410. The bit line (e.g., bit line 210) can comprise a resistance that can be represented as a resistor 412 (R$_{BL}$). The memory write model 400 also can comprise a PDRV element 414 (e.g., PMOS driver (PDRV) transistor) and an NDRV element 416 (e.g., NMOS driver (NDRV) transistor) that can be associated with the write data driver. The NPD element 406 and the NDRV element 416 can be associated with (e.g., connected to) the ground 418. The PUP element 404 and the PDRV element 414 can be associated with the power supply component 420.

In the case of writing a "0" or "low" data value (e.g., a digital "0" value) to the memory cell, where the existing data value of DL is also a "0" or "low" data value, the NPD element 406 and the PDRV element 414 of the memory write model 400 can drop out (e.g., can be eliminated, non-existent, or not relevant) to the memory write model 400, which can leave remaining the PUP element 404, the NPASS element 408, the NDRV element 416, and the bit line, including the resistor 412. In a DC model, the remaining transistors (e.g., the PUP element 404, the NPASS element 408, and the NDRV element 416) can be directly replaced by resistors to make the analysis less complex, as illustrated in the resistance write model 500 of FIG. 5. In the resistance write model 500, a resistor$_{PUP}$ 502 (R$_{Pup}$) can represent the resistance associated with the PUP element 404, a resistor$_{Npass}$ 504 (R$_{Npass}$) can represent the resistance associated with the NPASS element 408, a resistor 506 (R$_{BL}$) can represent the resistance associated with the bit line resistance (e.g., the resistor 412 (R$_{BL}$)), a resistor$_{NDRV}$ 508 (R$_{NDRV}$) can represent the resistance associated with the NDRV element 416.

Also, in the resistance write model 500 of FIG. 5, a power supply component 510 can have a voltage level (e.g., V$_{DD}$) and can represent the power supply component 420 of FIG. 4. The ground 512 in the resistance write model 500 of FIG. 5 can have a voltage (V$_{gnd}$) and can represent the voltage level at the ground 418 in the memory write model 400 of FIG. 4.

The voltage level observed on V$_{out}$ can determine whether the memory cell successfully writes, since the V$_{out}$ signal can directly feed back and can affect the DL signal. In this case, V$_{out}$ would want to be close to the value of V$_{gnd}$. The value (e.g., level) of V$_{out}$ can be determined by the following Equation (Eq.) (1):

$$V_{out} = V_{DD} - ((V_{DD} - V_{gnd}) * R_{Pup})/(R_{Pup} + R_{Npass} + R_{BL} + R_{NDRV})).$$ Eq. (1)

As R$_{BL}$ increases, it can become increasingly more difficult to keep V$_{out}$ at a desirably low voltage level that can facilitate enabling a successful and/or efficient writing of data to the memory cell.

Figure 6:
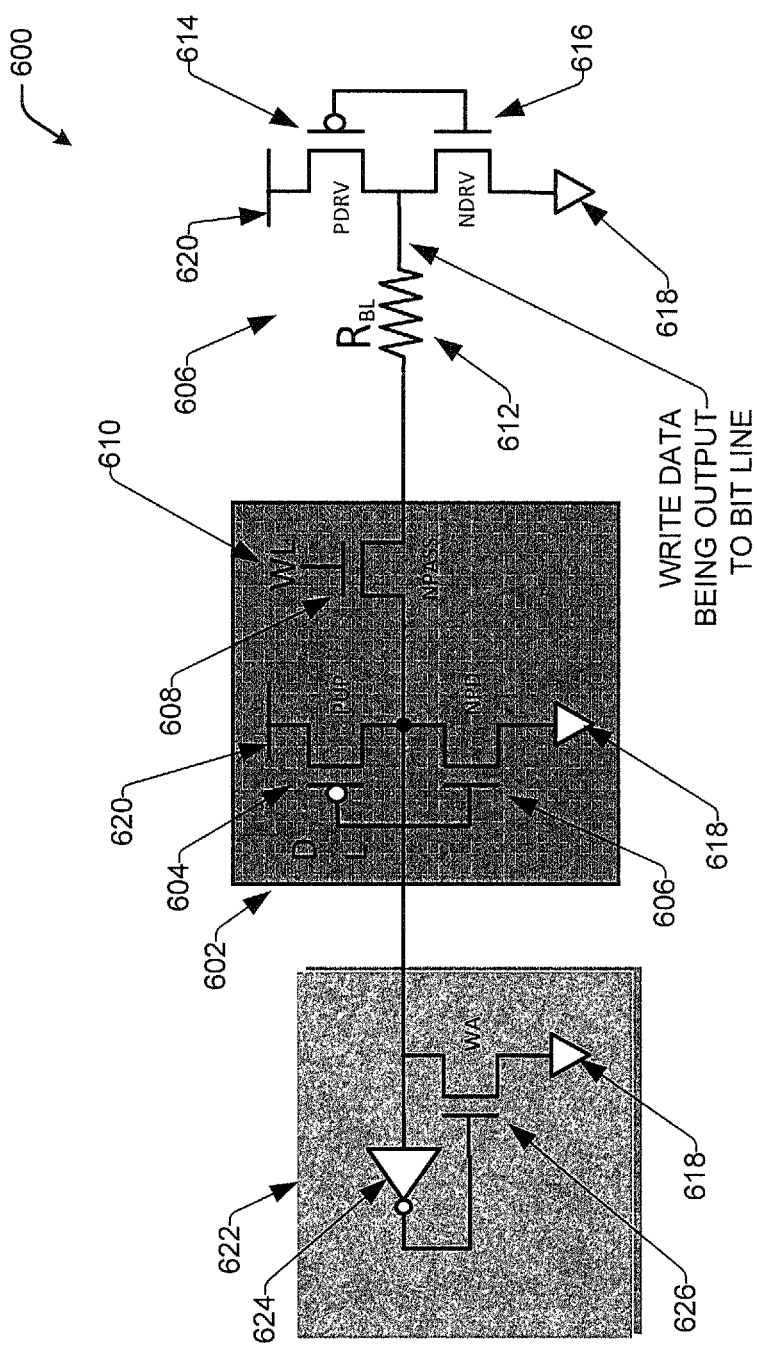
FIG. 6 depicts an example, non-limiting memory write model that can employ a write assist to efficiently perform write operations in a memory comprising memory cells, in accordance with various aspects and embodiments of the disclosed subject matter.
Figure 7:
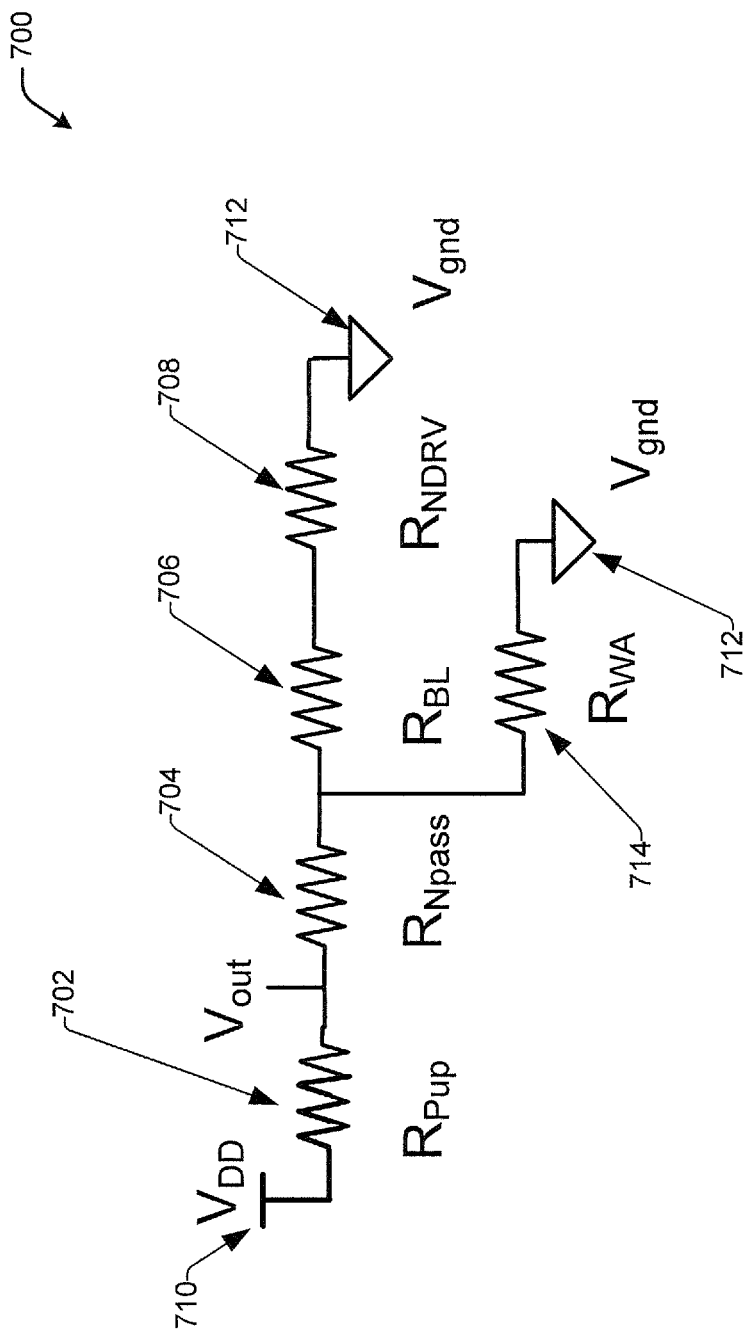
FIG. 7 illustrates an example, non-limiting resistance write model that can correspond to the write assist that can be employed to efficiently perform write operations in a memory comprising memory cells, in accordance with various aspects and embodiments of the disclosed subject matter

Referring briefly to FIGS. 6 and 7 (along with FIG. 2 and FIG. 3), FIG. 6 depicts an example, non-limiting memory write model 600 that can employ a write assist to efficiently perform write operations in a memory comprising memory cells, in accordance with various aspects and embodiments of the disclosed subject matter. FIG. 7 illustrates an example, non-limiting resistance write model 700 that can correspond to the write assist that can be employed to efficiently perform write operations in a memory comprising memory cells, in accordance with various aspects and embodiments of the disclosed subject matter.

The memory write model 600 can model a memory cell (e.g., 208) and other circuitry associated with the memory cell during a write operation with a write assist from the write assist component (e.g., write assist component 222a). The memory write model 600 can represent the design elements of the system 200, including the write assist functionality of the write assist component 222a. The resistance write model 700 can comprise a resistor modeling of the active devices of the circuit of or associated with the memory cell (e.g., memory cell$_n$ 208), wherein the resistance write model 700 can effectively be a direct current (DC) model of the circuit of the memory write model 600.

The memory write model 600 can comprise memory cell portion 602 that can be a part of a memory cell (e.g., memory cell$_n$ 208) of the system 200 of FIG. 2. The memory cell portion 602 can include a PUP element 604 (e.g., PUP transistor), NPD element 606 (e.g., NPD transistor), and NPASS element 608 (e.g., NMOS pass transistor (NPASS transistor)), wherein the NPASS element 608 can be associated with a word line 610. The bit line (e.g., bit line 210)

can comprise a resistance that can be represented as a resistor 612 ($R_{BL}$). The memory write model 600 also can comprise a PDRV element 614 (e.g., PDRV transistor) and an NDRV element 616 (e.g., NDRV transistor) that can be associated with the write data driver. The NPD element 606 and the NDRV element 616 can be associated with (e.g., connected to) the ground 618. The PUP element 604 and the PDRV element 614 can be associated with the power supply component 620, which can provide a desired voltage (e.g., $V_{DD}$) to various associated components of the circuit.

The memory write model 600 also can comprise a write assist component 622 that can comprise an inverter 624 that can have an input (e.g., input port) that can be associated with the bit line (e.g., bit line 210). The write assist component 622 can include a transistor 626 (e.g., WA), which can be an NMOS, wherein the output (e.g., output port) of the inverter 624 can be associated with the gate of the transistor 626. The drain of the transistor 626 can be associated with (e.g., connected to) the bit line (e.g., bit line 210), and the source of the transistor 626 can be associated with (e.g., connected to) the ground 618.

In the case of writing a "0" or "low" data value (e.g., a digital "0" value) to the memory cell, where the existing data value of DL is also a "0" or "low" data value, the NPD element 606 and the PDRV element 614 of the memory write model 600 can drop out (e.g., can be eliminated, non-existent, or not relevant) to the memory write model 600, which can leave remaining the PUP element 604, the NPASS element 608, the NDRV element 616, and the bit line, including the resistor 612. In a DC model, the remaining transistors (e.g., the PUP element 604, the NPASS element 608, and the NDRV element 616) can be directly replaced by resistors to make the analysis less complex, as illustrated in the resistance write model 700 of FIG. 7. In the resistance write model 700, a resistor$_{PUP}$ 702 ($R_{Pup}$) can represent the resistance associated with the PUP element 604, a resistor$_{Npass}$ 704 ($R_{Npass}$) can represent the resistance associated with the NPASS element 608, a resistor 706 ($R_{BL}$) can represent the resistance associated with the bit line resistance (e.g., the resistor 612 ($R_{BL}$)), a resistor$_{NDRV}$ 708 ($R_{NDRV}$) can represent the resistance associated with the NDRV element 616.

Also, in the resistance write model 700 of FIG. 7, a power supply component 710 can have (e.g., can provide or produce) a voltage level (e.g., $V_{DD}$) and can represent the power supply component 620 of FIG. 6. The ground 712 in the resistance write model 700 of FIG. 7 can have a voltage ($V_{gnd}$) and can represent the voltage level at the ground 618 in the memory write model 600 of FIG. 6.

The resistance write model 700 of FIG. 7 also can comprise a resistor 714 ($R_{WA}$) that can represent the resistance associated with the transistor 626 of the write assist component 622 of FIG. 6. In the resistance write model 700, one end of the resistor 714 ($R_{WA}$) can be associated with the resistor$_{Npass}$ 704 ($R_{Npass}$) and the resistor 612 ($R_{BL}$), and the other end of the resistor 714 ($R_{WA}$) can be associated with the ground 712. Thus, as can be observed, the write assist component can add or create an additional current path to the ground 712. It is to be appreciated and understood that, in other embodiments, such as embodiments employing PMOSs, the write assist component can add an additional current path to the power supply component; and in still other embodiments, such as embodiments employing CMOSs, the write assist component can add an additional current path to the ground and/or the power supply component.

The voltage level observed on $V_{out}$ can determine whether the memory cell successfully writes, since the $V_{out}$ signal can directly feed back and can affect the DL signal of the memory latch of the memory cell portion 602. In this case, it can be desirable to have $V_{out}$ be close to the value of $V_{gnd}$. The value (e.g., level) of $V_{out}$ for the resistance write model 700 comprising the write assist can be determined by the following Equation (Eq.) (2):

$$V_{out}=V_{DD}-((V_{DD}-V_{gnd})*R_{Pup})/(R_{Pup}+R_{Npass}+(1/(R_{WA}+1/(R_{BL}+R_{NDRV})))).$$ Eq. (2)

As can be observed from the resistance write model 700 and Eq. (2), the write assist provided by the write assist component 622 (e.g., as modeled by the resistor 714 ($R_{WA}$) in FIG. 7) can maintain $V_{out}$ at a desirably low level, even as the resistance of the resistor 706 ($R_{BL}$) ostensibly increases.

Figure 8:
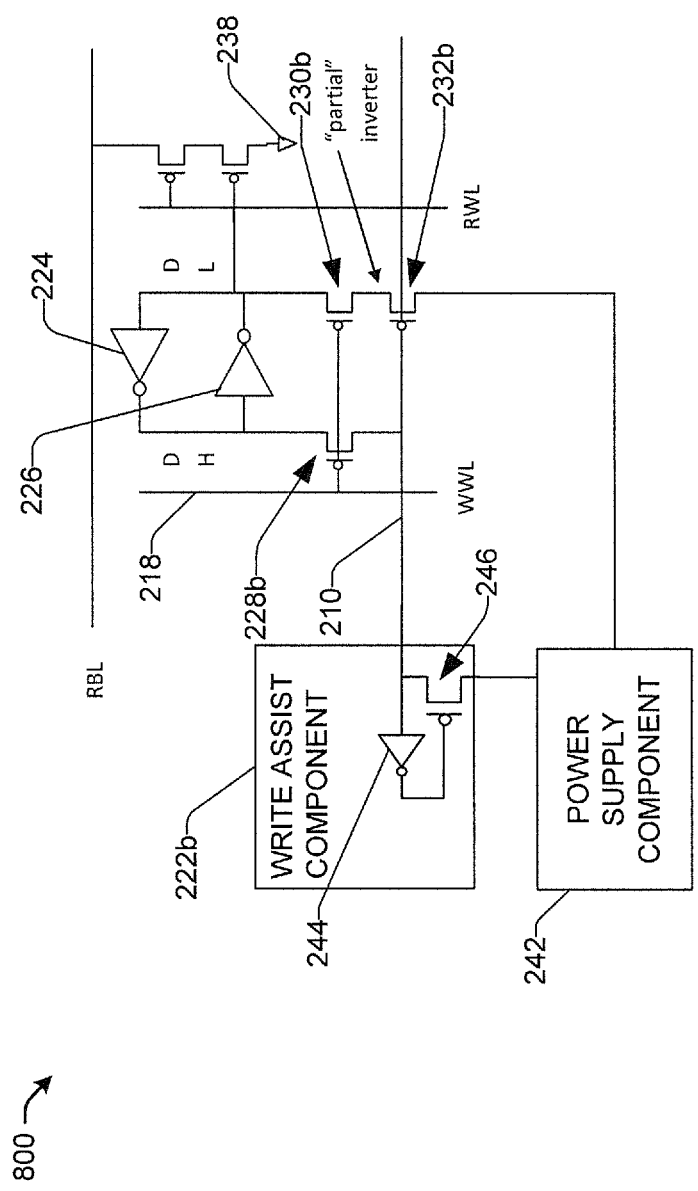
FIG. 8 presents a diagram of an example, non-limiting portion of a system that can employ write assists to efficiently perform write operations in a memory comprising memory cells that can be associated with write circuits that can employ p-channel metal-oxide-semiconductor field-effect transistors (PMOSs), in accordance with various aspects and embodiments of the disclosed subject matter.

In alternative embodiments, the memory cells can be associated with write circuits that can comprise transistors that can be PMOSs. Referring briefly to FIG. 8 (along with FIG. 2), FIG. 8 presents a diagram of an example, non-limiting portion 800 of the system 200 that can employ write assists to efficiently perform write operations in a memory comprising memory cells that can be associated with write circuits that can employ PMOSs, in accordance with various aspects and embodiments of the disclosed subject matter.

The non-limiting portion 800 of the system 200 can comprise the memory latch, which can comprise the first inverter 224 and the second inverter 226. The memory latch formed by the first inverter 224 and second inverter 226 can be associated with (e.g., connected to) the bit line 210 (WBL) via a first transistor 228b and via the transistor stack to the power supply component 242, wherein the transistor stack can comprise a second transistor 230b and a third transistor 232b, and wherein the gate of the third transistor 232b can be connected to the bit line 210. The gates of the first transistor 228b and the second transistor 230b can be associated with (e.g., connected to) the word line$_n$ 218.

In such embodiments having a PMOS write-circuit configuration, the write assist component 222 can be or can comprise write assist component 222b. The write assist component 222b can be associated with (e.g., connected to) the power supply component 242 to facilitate creating or adding an additional current path to the power supply component 242 during write operations.

During a write operation to write to the memory cell$_n$ 208 (e.g., memory cell comprising inverters 224 and 226 that can be formed using CMOS transistors), the write assist component 222b can be configured to facilitate adding or creating an additional current path to a power supply component 242 at (or in relative proximity to) the far end of the bit line 210 (e.g., at (or in relative proximity to) the end of the bit line 210 where the write assist component 222b is located) when an appropriate write polarity (e.g., a "1" or "high" voltage level, in the case of a PMOS write-circuit configuration) is applied to the bit line 210 by the voltage component 220 via the inverter 240 at the other end of the bit line 210. For instance, the write assist component 222b can comprise an inverter 244 that can be associated with (e.g., connected to) the bit line 210 at the input of the inverter 244. The write assist component 222b also can comprise a transistor 246, which can be an PMOS, wherein the output of the inverter 244 can be connected to the gate of the transistor 246. The source of the transistor 246 can be associated with (e.g., connected to) the power supply component 242 (e.g., producing a voltage $V_{DD}$), and the drain of the transistor 246 can be associated with (e.g., connected to) the bit line 210.

During a write operation to write a "1" or "high" data value to the memory cell$_n$ 208 (e.g., when the memory cell$_n$ 208 currently has a "0" or "low" data value stored therein), the voltage component 220 can apply a desired (e.g., defined) high voltage to the bit line 210 (e.g., a desired high voltage that can be output from inverter 240, which can be situated between the voltage component 220 and the bit line 210 at the output of the inverter 240), wherein the desired high voltage can correspond to the "1" or "high" data value. A desired (e.g., defined voltage level (e.g., a word line activation voltage) can be applied to the word line$_n$ 218 associated with the memory cell$_n$ 208 to activate the word line$_n$ 218 to facilitate performing the write operation to write the desired data value (e.g., a "1" or "high" data value) to the memory cell$_n$ 208. The desired high voltage applied to the bit line 210 also can be applied to the write assist component 222b located at the opposite end of the bit line 210. In response to receiving the desired high voltage from the bit line 210, the write assist component 222b can create or add an additional current path to the power supply component 242, for example, at or near the far (e.g., opposite) end of the bit line 210 in proximity to where the write assist component 222b is located (e.g., by turning on the transistor 246 associated with the bit line 210 and the power supply component 242). For instance, the desired high voltage from the bit line 210 can be applied to the inverter 244, which can invert the high voltage signal to produce a desired low voltage level at the output. The low voltage level output from the inverter 244 can be applied to the gate of the transistor 246, which can switch on the transistor 246 to create or add the additional current path to the power supply component 242 at (or in relatively close proximity to) the far end of the bit line 210 (e.g., at (or in relatively close proximity to) the end of the bit line 210 where the write assist component 222b is located).

This write assist (e.g., by adding the additional current path to the the power supply component 242) by the write assist component 222b can control, mitigate (e.g., mitigate the effects of), or reduce the effective resistance of the bit line 210, which can control, mitigate, or reduce IR loss of the write signal (e.g., the desired high voltage corresponding to a "1" or "high" data value) being applied to the bit line 210 and can facilitate enabling (e.g., efficiently enabling) the voltage component 220 to apply the desired write voltage level to the memory cell$_n$ 208 to write the desired data value (e.g., "1" or "high" data value) to the memory cell$_n$ 208.

Figure 9:
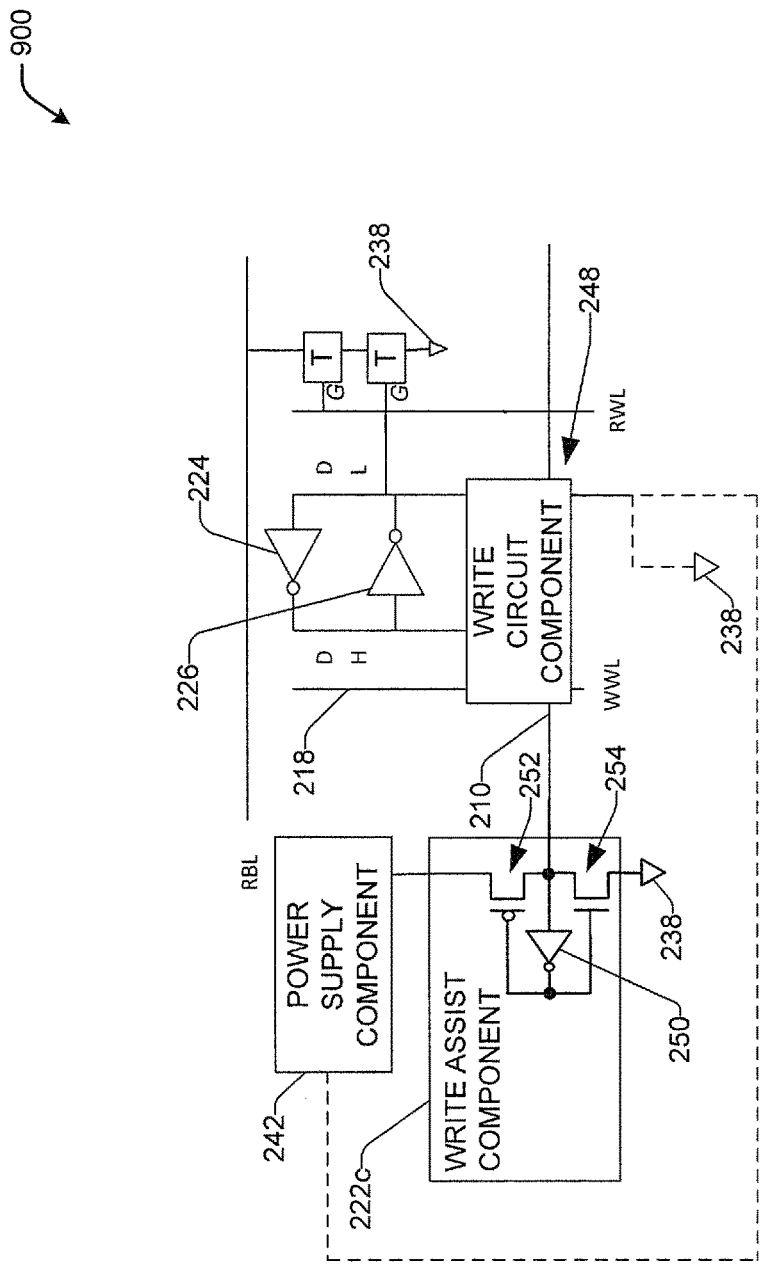
FIG. 9 depicts a diagram of an example, non-limiting portion of a system that can employ write assists to efficiently perform write operations in a memory comprising memory cells that can be associated with write circuits that can employ either NMOSs, or PMOSs, or CMOSs, in accordance with various aspects and embodiments of the disclosed subject matter.

Referring briefly to FIG. 9 (along with FIG. 2), FIG. 9 depicts a diagram of an example, non-limiting portion 900 of the system 200 that can employ write assists to efficiently perform write operations in a memory comprising memory cells that can be associated with write circuits that can employ either NMOSs, or PMOSs, or CMOSs, in accordance with various aspects and embodiments of the disclosed subject matter. In some embodiments, the set of memory cells (e.g., 202, 204, 206, 208, . . . ), including the memory cell$_n$ 208, can be associated with write circuits that can comprise transistors that can be either NMOSs or PMOSs. It is to be appreciated and understood that, although it is not typical to employ CMOSs in write circuits associated with memory cells (e.g., 6T SRAM, memory cells having single ended read and write bit lines), in some implementations, the transistors of the write circuits associated with the set of memory cells can be CMOSs.

For instance, the example, non-limiting portion 900 of the system 200 can comprise a write circuit component 248 that can comprise transistors that can be respectively associated with (e.g., connected to) the memory latch, which can include the first inverter 224 and the second inverter 226. The write circuit component 248 also can be connected to the word line$_n$ 218, wherein the word line$_n$ 218 can be connected to the gates of certain transistors of the write circuit component 248 based at least in part on the configuration of the write circuit component 248. The write circuit component 248 also can be connected to the bit line 210. During a write operation, the write circuit component 248 can be associated with (e.g., connected to) the ground 238 or the power supply component 242 based at least in part on the particular write polarity applied during a particular write operation.

In some implementations, when an NMOS write-circuit configuration is employed, the write circuit component 248 can be configured to be the same as or similar to the write circuit of FIG. 3, with the write circuit component 248 comprising a first transistor (e.g., 228a), a second transistor (e.g., 230a), and third transistor (e.g., 232a) that can be arranged and connected with other circuit components as depicted in the write circuit of FIG. 3. In other implementations, when a PMOS write-circuit configuration is employed, the write circuit component 248 can be configured to be the same as or similar to the write circuit of FIG. 8, with the write circuit component 248 comprising a first transistor (e.g., 228b), a second transistor (e.g., 230b), and third transistor (e.g., 232b) that can be arranged and connected with other circuit components as depicted in the write circuit of FIG. 8. In still other implementations, a CMOS write-circuit configuration can be employed. With regard to the CMOS write-circuit configuration, the write circuit component 248 can comprise a respective transistor and circuitry configuration that is suitable for facilitating the performance of write operations on a memory cell(s) (e.g., memory cell$_n$ 208) with CMOS transistors being employed in the write circuit component 248.

To facilitate desirable performance of write operations, the write assist component 222 can be or can comprise write assist component 222c. The write assist component 222c can perform write assists that can be beneficial in facilitating the performance of write operations. For instance, the write assists performed by the write assist component 222c can mitigate bit line resistance of the bit line 210 for any circuit configuration that sinks current to ground 238 or sources current from the power supply component 242.

The write assist component 222c can be associated with (e.g., connected to) the bit line 210 at or near the end of the bit line 210 that is opposite the end where the voltage component 220 is located. For example, the write assist component 222c can be associated with the bit line 210 at the end of the bit line 210 that is opposite the end where the voltage component 220 is located, or can be associated with the bit line 210 at a different point in the bit line 210, such as a point of the bit line 210 between memory cell$_n$ 208 and memory cell$_{n-1}$, or another desired point.

The write assist component 222c can be associated with (e.g., connected to) the ground 238 and the power supply component 242 to facilitate creating or adding an additional current path to the ground 238 or the power supply component 242 during write operations. For example, during a write operation to write a "0" or "low" data value to a memory cell (e.g., memory cell$_n$ 208), the write assist component 222c can create an additional path to the ground 238. During a write operation to write a "1" or "high" data value to a memory cell (e.g., memory cell$_n$ 208), the write assist component 222c can create an additional path to the power supply component 242.

During a write operation to write to the memory cell$_n$ 208, the write assist component 222c can be configured to facilitate creating an additional current path to the ground 238 or to the power supply component 242 at (or in relatively close proximity to) the far end of the bit line 210 (e.g., at (or in relatively close proximity to) the end of the bit line 210 where the write assist component 222c is located) when an appropriate write polarity (e.g., a "0" or "low" voltage level, in the case of writing a "0" or "low" value to the memory cell; or a "1" or "high" voltage level, in the case of writing a "1" or "high" value to the memory cell) is applied to the bit line 210 by the voltage component 220 via the inverter 240 at the other end of the bit line 210. For instance, the write assist component 222c can comprise an inverter 250 that can be associated with (e.g., connected to) the bit line 210 at the input of the inverter 250. The write assist component 222c also can comprise a transistor 252, which can be an PMOS, wherein the output of the inverter 250 can be connected to the gate of the transistor 252. The source of the transistor 252 can be associated with (e.g., connected to) the power supply component 242 (e.g., V$_{DD}$), and the drain of the transistor 252 can be associated with (e.g., connected to) the bit line 210. The write assist component 222c also can comprise a transistor 254, which can be an NMOS, wherein the output of the inverter 250 can be connected to the gate of the transistor 254. The drain of the transistor 254 can be associated with (e.g., connected to) the bit line 210, and the source of the transistor 254 can be associated with (e.g., connected to) the ground 238.

During a write operation to write a "0" or "low" data value to the memory cell$_n$ 208 (e.g., when the memory cell$_n$ 208 currently has a "1" or "high" data value stored therein), the voltage component 220 can apply a desired low voltage to the bit line 210 via the output of the inverter 240, wherein the desired low voltage can correspond to the "0" or "low" data value. A desired voltage level (e.g., a word line activation voltage) can be applied to the word line$_n$ 218 associated with the memory cell$_n$ 208 to activate the word line$_n$ 218 to facilitate performing the write operation to write the desired data value (e.g., a "0" or "low" data value) to the memory cell$_n$ 208. The desired low voltage applied to the bit line 210 also can be applied to the write assist component 222c located at the opposite end of the bit line 210. In response to receiving the desired low voltage from the bit line 210, the write assist component 222c can create or open an additional current path to the ground 238 at or near the far (e.g., opposite) end of the bit line 210 in proximity to where the write assist component 222c is located. For instance, the desired low voltage from the bit line 210 can be applied to the inverter 250, which can invert the signal to produce a desired high voltage level at the output of the inverter 250. The high voltage level can be applied to the gate of the transistor 254, which can switch on the transistor 254 to create or add the additional current path to the ground 238 at (or in relatively close proximity to) the far end of the bit line 210 (e.g., at (or in relatively close proximity to) the end of the bit line 210 where the write assist component 222c is located). The high voltage level also can be applied to the gate of the transistor 252 which can turn off or maintain the transistor 252 in the off state.

During a write operation to write a "1" or "high" data value to the memory cell$_n$ 208 (e.g., when the memory cell$_n$ 208 currently has a "0" or "low" data value stored therein), the voltage component 220 can apply a desired high voltage to the bit line 210 via the output of the inverter 240, wherein the desired high voltage can correspond to the "1" or "high" data value. A desired voltage level (e.g., a word line activation voltage) can be applied to the word line$_n$ 218 associated with the memory cell$_n$ 208 to activate the word line$_n$ 218 to facilitate performing the write operation to write the desired data value (e.g., a "1" or "high" data value) to the memory cell$_n$ 208. The desired high voltage applied to the bit line 210 also can be applied to the write assist component 222c. In response to receiving the desired high voltage from the bit line 210, the write assist component 222c can create an additional current path to the power supply component 242, which can be in proximity to where the write assist component 222c is located. For instance, the desired high voltage from the bit line 210 can be applied to the inverter 250, which can invert the high voltage signal to produce a desired low voltage level at the output of the inverter 250. The low voltage level output from the inverter 250 can be applied to the gate of the transistor 252, which can switch on the transistor 252 to create or add the additional current path to the power supply component 242 at (or in relatively close proximity to) the far end of the bit line 210 (e.g., at (or in relatively close proximity to) the end of the bit line 210 where the write assist component 222c is located). The low voltage level also can be applied to the gate of the transistor 254 which can turn off or maintain the transistor 254 in the off state.

This write assist (e.g., by adding the additional current path to the ground 238 or the power supply component 242) by the write assist component 222c can control, mitigate (e.g., mitigate the effects of), or reduce the effective resistance of the bit line 210, which can control, mitigate, or reduce IR loss of the write signal (e.g., the desired high voltage corresponding to a "1" or "high" data value, or the desired low voltage corresponding to a "0" or "low" data value) being applied to the bit line 210 and can facilitate enabling (e.g., efficiently enabling) the voltage component 220 to apply the desired write voltage level to the memory cell$_n$ 208 to write the desired data value (e.g., "1" or "high" data value, or "0" or "low" data value) to the memory cell$_n$ 208.

It is to be appreciated and understood that, while the write assists disclosed herein have primarily been related to using an NMOS-based write assist (e.g., using write assist component 222a in connection with an NMOS write-circuit configuration) to facilitate writing a "0" or "low" data value to a memory cell (e.g., the memory cell$_n$ 208) when the memory cell currently has a "1" or "high" data value stored therein, or using an PMOS-based write assist (e.g., using write assist component 222b in connection with a PMOS write-circuit configuration) to facilitate writing a "1" or "high" data value to a memory cell (e.g., the memory cell$_n$ 208) when the memory cell currently has a "0" or "low" data value stored therein, the disclosed subject matter is not limited to such uses. For example, with regard to an NMOS write-circuit configuration (e.g., if the write circuit component 248 had an NMOS configuration), as desired, the write assist component 222c of FIG. 9 also can be employed to provide a write assist, e.g., by creating an additional current path to the power supply component 242, to facilitate writing a "1" or "high" data value to a memory cell (e.g., the memory cell$_n$ 208) when the memory cell currently has a "0" or "low" data value stored therein. Such write assist in connection with writing a "1" or "high" data value to the memory cell can mitigate bit line resistance and/or can speed up the performance of the write operation as compared to the write speed without such write assist being performed. It is noted that, since, with regard to the NMOS write-circuit configuration, the writability issues for writing a "1" or "high" data value to the memory cell when the memory cell currently has a "0" or "low" data value stored therein is typically not as problematic as the writability issues (e.g., due in part to bit line resistance) for writing a "0" or "low" data value to the memory cell when the memory cell currently has a "1" or "high" data value stored therein, the write assist provided by the write assist component 222c in the former case (e.g., writing a "1" to the memory cell) may not be quite as strong or significant as the write assist that the write assist component 222c provides in the latter case (e.g., writing a "0" to the memory cell). However, the write assist in the former case still can provide some benefit (e.g., can mitigate bit line resistance and/or can speed up performance of the write operation).

As another example, with regard to a PMOS write-circuit configuration (e.g., if the write circuit component 248 had a PMOS configuration), as desired, the write assist component 222c also can be employed to provide a write assist, e.g., by creating an additional current path to the ground 238, to facilitate writing a "0" or "low" data value to a memory cell (e.g., the memory cell$_n$ 208) when the memory cell currently has a "1" or "high" data value stored therein. This PMOS-based write assist in connection with writing a "0" or "low" data value to the memory cell can mitigate bit line resistance and/or can speed up the performance of such a write operation. It is noted that, since, with regard to the PMOS write-circuit configuration, the writability issues for writing a "0" or "low" data value to the memory cell when the memory cell currently has a "1" or "high" data value stored therein is normally not as problematic as the writability issues (e.g., due in part to bit line resistance) for writing a "1" or "high" data value to the memory cell when the memory cell currently has a "0" or "low" data value stored therein, the write assist provided by the write assist component 222c in the former case (e.g., writing a "0" to the memory cell) may not be as strong or significant as the write assist that the write assist component 222c can provide in the latter case (e.g., writing a "1" to the memory cell). The write assist in the former case though still can provide some benefit (e.g., can mitigate bit line resistance and/or can speed up performance of the write operation).

Figure 10:
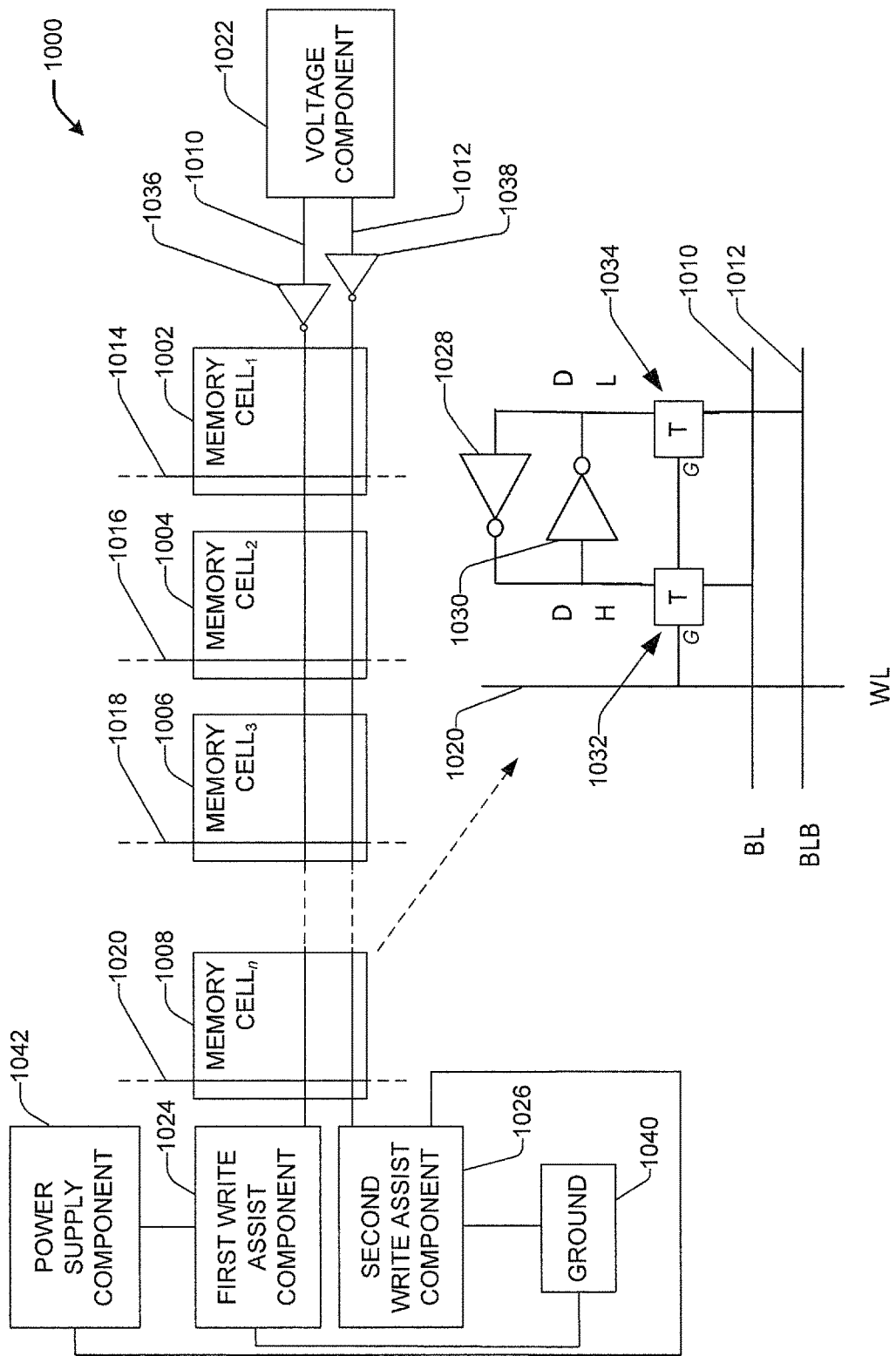
FIG. 10 presents a block diagram of an example, non-limiting system that can employ write assists to efficiently perform write operations in a memory comprising memory cells associated with complementary bit lines, in accordance with various aspects and embodiments of the disclosed subject matter.

Turning to FIG. 10, FIG. 10 presents a block diagram of an example, non-limiting system 1000 that can employ write assists to efficiently perform write operations in a memory comprising memory cells associated with complementary bit lines, in accordance with various aspects and embodiments of the disclosed subject matter. The system 1000 can be or can be part of a memory, for example.

The system 1000 can comprise a set of memory cells, comprising memory cell$_1$ 1002, memory cell$_2$ 1004, memory cell$_3$ 1006, up through memory cell$_n$ 1008, wherein n can be virtually any desired integer number. The set of memory cells (e.g., 1002, 1004, 1006, 1008, . . . ) can comprise, for example, memory cells that can employ complementary or differential bit lines. For example, the set of memory cells can comprise SRAM cells that comprise complementary bit lines. It is to be appreciated and understood that other types of memory cells can be employed in memory of the system 1000, in accordance with various aspects and embodiments of the disclosed subject matter. The memory, comprising the set of memory cells, can comprise volatile memory or non-volatile memory.

The set of memory cells (e.g., 1002, 1004, 1006, 1008, . . . ) can be associated with (e.g., connected to) a bit line 1010 and a complementary bit line 1012 that can facilitate writing data (e.g., one or more bits of data having data values, such as a "0" or "low", or a "1" or "high") to respective memory cells (e.g., 1002, 1004, 1006, 1008, . . . ) of the set of memory cells when one or more of the respective memory cells are selected for a write operation. The respective memory cells (e.g., 1002, 1004, 1006, 1008, . . . ) of the set of memory cells can be associated with (e.g., connected to) respective word lines of a set of word lines, comprising word line$_1$ 1014, word line$_2$ 1016, word line$_3$ 1018, up through word line$_n$ 1020. During a write operation, a desired voltage level from a voltage source (not shown in FIG. 10) can be applied to a desired word line (e.g., word line$_n$ 1020) to activate the word line to facilitate writing a data value being applied to the bit line 1010 to the desired memory cell (e.g., memory cell$_n$ 1008) associated with the desired word line$_n$ wherein the data value can be based at least in part on a voltage level (e.g., the write voltage) applied to the bit line 1010 associated with the desired memory cell.

It is to be appreciated and understood that, for reasons of brevity and clarity, in the system 1000, only one set of complementary bit lines (e.g., bit line 1010 and bit line 1012), one set of memory cells (e.g., 1002, 1004, 1006, 1008, . . . ), and one set of word lines (e.g., 1014, 1016, 1018, 1020, . . . ) are depicted. It is to be appreciated and understood that the system 1000 can comprise one or more additional sets of memory cells that can be respectively associated with one or more additional sets of complementary bit lines and respective word lines of the set of word lines.

The system 1000 can comprise a voltage component 1022 that, during a write operation, can apply a particular voltage level (e.g., a particular write voltage) to the bit line 1010, and a particular complementary voltage level to the complementary bit line 1012, to facilitate storing a particular data value, which can correspond to the particular voltage level, in a memory cell(s) (e.g., 1002, 1004, 1006, 1008, . . . ) that has been activated for the write operation (e.g., by applying a specified voltage to the write line(s) associated with the memory cell(s)). For instance, in connection with a write operation, the particular first voltage level can be a first voltage level that can correspond to a first data value (e.g., "0" or "low" data value) or a second voltage level that can correspond to a second data value (e.g., "1" or "high" data value), wherein the particular complementary voltage level can be a first complementary voltage level that can be the binary opposite of the first voltage level or a second complementary voltage level that can be the binary opposite of the second voltage level, respectively. That is, if the first voltage level corresponds to a "0" or "low" voltage, the first complementary voltage level can correspond to a "1" or "high" voltage; and conversely, if the second voltage level corresponds to a "1" or "high" voltage, the first complementary voltage level can correspond to a "0" or "low" voltage.

To facilitate overcoming potential writability problems, such as writability problems relating to bit line resistance, and/or to enable write operations to be performed more efficiently (e.g. to enable write operations to be performed more quickly), the system 1000 can comprise a first write assist component 1024 that can be associated with (e.g., connected to) the bit line 1010 at (or in relatively close proximity to) the far end of the bit line 1010 that is at the opposite end of the bit line 1010 from the other end of the bit line 1010 where the voltage component 1022 is located. By being associated with the bit line 1010, the first write assist component 1024 also can be associated with the set of memory cells (e.g., 1002, 1004, 1006, 1008, . . . ) associated with the bit line 1010. The system 1000 also can comprise a second write assist component 1026 that can be associated with (e.g., connected to) the complementary bit line 1012 at (or in relatively close proximity to) the far end of the complementary bit line 1012 that is at the opposite end of the complementary bit line 1012 from the other end of the complementary bit line 1012 where the voltage component 1022 is located. By being associated with the complementary bit line 1012, the second write assist component 1026 also can be associated with the set of memory cells (e.g., 1002, 1004, 1006, 1008, . . . ) associated with the complementary bit line 1012. In accordance with various implementations, the first write assist component 1024 and second write assist component 1026 can be the same as or similar to write assist component 222a, write assist component 222b, or write assist component 222c.

As the potential writability problems can be more likely to occur with regard to the memory cell$_n$ 1008 (or one or more other memory cells) at (or near) the far end of the bit lines 1010 and 1012 at or near the opposite end of the bit lines 1010 and 1012 from the other end of the bit lines 1010 and 1012 where the voltage component 1022 is located, a write operation relating to the memory cell$_n$ 1008 will be described herein to facilitate illustrating aspects and embodiments of the disclosed subject matter. The memory cell$_n$ 1008 can be, for example, a memory cell that can be associated with complementary bit lines, such as a memory cell that can be the same as or similar to the memory cell (e.g., 1700) as described with regard to FIG. 17, although it is to be appreciated and understood that the aspects and embodiments of the disclosed subject matter can be applied to other types of memory cells that employ complementary bit lines.

The memory cell (e.g., memory cell 1002, 1004, 1006, 1008, . . . ) can comprise a first inverter 1028 and a second inverter 1030 (e.g., cross-coupled inverters) that can be cross-connected to each other to form a latch. The first inverter 1028 and the second inverter 1030 each can comprise and can be formed using two transistors (not shown). The transistors of the first inverter 1028 and the second inverter 1030 can be CMOSs, for example.

The memory cell (e.g., 6T SRAM cell) can use differential bit lines which can show how pass transistors can be used to write data to the memory cell. For instance, the latch formed by the first inverter 1028 and the second inverter 1030 can be respectively connected to complementary bit lines comprising a first bit line 1010 (BL) and a second bit line 1012 (BLB) via a first transistor 1032 and a second transistor 1034, respectively, wherein the first transistor 1032 and the second transistor 1034 can be part of the write circuit. In accordance with various implementations, the first transistor 1032 and the second transistor 1034 can be either NMOSs or PMOSs.

The gates of the first transistor 1032 and the second transistor 1034 can be associated with (e.g., connected to) a word line (e.g., 1014, 1016, 1018, or 1020, . . . ). In the case when the write circuit is an NMOS write circuit (e.g., when the first transistor 1032 and second transistor 1034 are NMOSs), when a word line is at ground level, the first transistor 1032 and the second transistor 1034 can be turned off (e.g., can be in an off state) and the latch can retain its current state (e.g., data state). When a word line associated with a memory cell is at a high level (e.g., when the word line is activated for a write operation), the first transistor 1032 and the second transistor 1034 can be turned on (e.g., can be in an on state) and the data value on the bit line can be applied to the latch of the memory cell (e.g., to change the data state of the latch to the data value provided by the bit line).

In the case when the write circuit is a PMOS write circuit (e.g., when the first transistor 1032 and second transistor 1034 are PMOSs), when a word line is at power supply level, the first transistor 1032 and the second transistor 1034 can be turned off (e.g., can be in an off state) and the latch can retain its current state (e.g., data state). When a word line associated with a memory cell is at a low level (e.g., when the word line is activated for a write operation), the first transistor 1032 and the second transistor 1034 can be turned on (e.g., can be in an on state) and the data value on the bit line can be applied to the latch of the memory cell (e.g., to change the data state of the latch to the data value provided by the bit line).

Since complementary bit lines (e.g., 1010, 1012) are used, the write operations for the memory cell can be symmetrical (e.g., writing a "0" or "1" data value to the memory cell can always be a "push-pull" write to the two sides of the memory latch which can give equal write delay regardless of the data polarity being written). During a write operation, the voltage component 1022 can apply a desired write voltage, which can correspond to the data value that is to be stored in the memory cell (e.g., memory cell$_n$ 1008), to the end of the first bit line 1010, a complementary voltage can be applied to the second bit line 1012, and a desired (e.g., appropriate) word line voltage can be applied to the word line (e.g., word line$_n$ 1020) to facilitate activating the word line to facilitate performing the write operation on the memory cell. Application of the desired write voltage by the voltage component 1022 to the first bit line 1010 and the complementary voltage to the second bit line 1012 can transition (e.g., force the transition) of the memory cell into the desired data state. The word line can be de-activated (e.g., by removing or discontinuing the word line voltage from or on the word line), wherein the memory cell can be maintained in the desired data state after the word line is de-activated.

The configuration of the first write assist component 1024 and the second write assist component 1026 can be based at least in part on the type of transistors (e.g., NMOSs, PMOSs) employed by the write circuits associated with the set of memory cells (e.g., 1002, 1004, 1006, 1008, . . . ). For example, the first write assist component 1024 and the second write assist component 1026 can be a first type of write assist component (e.g., write assist component 222a, comprising an NMOS) when the transistors (e.g., transistors 1032 and 1034) of the write circuits associated with the set of memory cells (e.g., 102, 104, 106, 108, . . . ) are NMOSs, a second type of write assist component (e.g., write assist component 222b, comprising a PMOS) when the transistors of the write circuits associated with the set of memory cells are PMOSs, or a third type of write assist component (e.g., write assist component 222c, comprising an NMOS and a PMOS) when the transistors of the write circuits associated with the set of memory cells are either NMOSs or PMOSs, as more fully described herein.

As an example, if the write circuits associated with the set of memory cells (e.g., 1002, 1004, 1006, 1008, . . . ) employ NMOS transistors, during a write operation to write a "0" or "low" data value to a memory cell (e.g., memory cell$_n$ 1008) associated with the first bit line 1010 (e.g., when the memory cell currently has a "1" or "high" data value stored therein), the voltage component 1022 can apply a desired low voltage to the first bit line 1010 (e.g., a desired low voltage output from an inverter 1036 between the voltage component 1022 and the first bit line 1010 at the output of the inverter 1036), wherein the desired low voltage can correspond to the "0" or "low" data value. The voltage component 1022 also can apply a desired high voltage to the second bit line 1012 (e.g., a desired high voltage output from an inverter 1038 between the voltage component 1022 and the second bit line 1012 at the output of the inverter 1038), wherein the desired high voltage can correspond to a "1" or "high" value.

A desired voltage level (e.g., word line activation voltage) can be applied to the word line (e.g., word line$_n$ 1020) associated with the memory cell (e.g., memory cell$_n$ 1008) to activate the word line to facilitate performing the write operation. The desired low voltage applied to the first bit line 1010 also can be applied to the first write assist component 1024. In response to receiving the desired low voltage, the first write assist component 1024 can open an additional current path to the ground 1040 at the far end of the first bit line 1010 in proximity to where the first write assist component 1024 is located (e.g., by turning on a transistor of the first write assist component 1024 that is associated with the first bit line 1010 and the ground 1040). This write assist (e.g., by adding the additional current path to the ground 1040) by the first write assist component 1024 can control, mitigate (e.g., mitigate the effects of), or reduce the effective resistance of the first bit line 1010, which can control, mitigate, or reduce IR loss of the write signal being applied to the first bit line 1010 and can facilitate enabling (e.g., efficiently enabling) the voltage component 1022 to apply the desired write voltage level to the memory cell (e.g., memory cell$_n$ 1008) to write the desired data value (e.g., "0" or "low" data value) to the memory cell. Meanwhile, the second write assist component 1026 can be receiving a high voltage from the second bit line 1012. As a result, the second write assist component 1026 can be in an off state (e.g., the transistor of the second write assist component 1026 can be switched off, thereby not creating an additional path to the ground 1040).

If the write circuits associated with the memory cells (e.g., 1002, 1004, 1006, 1008, . . . ) are configured to comprise PMOSs, the first write assist component 1024 and the second write assist component 1026 can be configured to be, and can function, the same as or similar to the write assist component 222b of FIG. 8 (e.g., to create an additional current path to the power supply component 1042, in response to the appropriate write polarity), as more fully described herein. If the write circuits associated with the memory cells (e.g., 1002, 1004, 1006, 1008, . . . ) are configured to comprise CMOSs (or alternatively NMOSs, or alternatively PMOSs), the first write assist component 1024 and the second write assist component 1026 can be configured to be, and can function, the same as or similar to the write assist component 222c of FIG. 9 (e.g., to create an additional current path to the ground 1040 or the power supply component 1042, based at least in part on (e.g., in response to) the particular write polarity applied), as more fully described herein.

Figure 11:
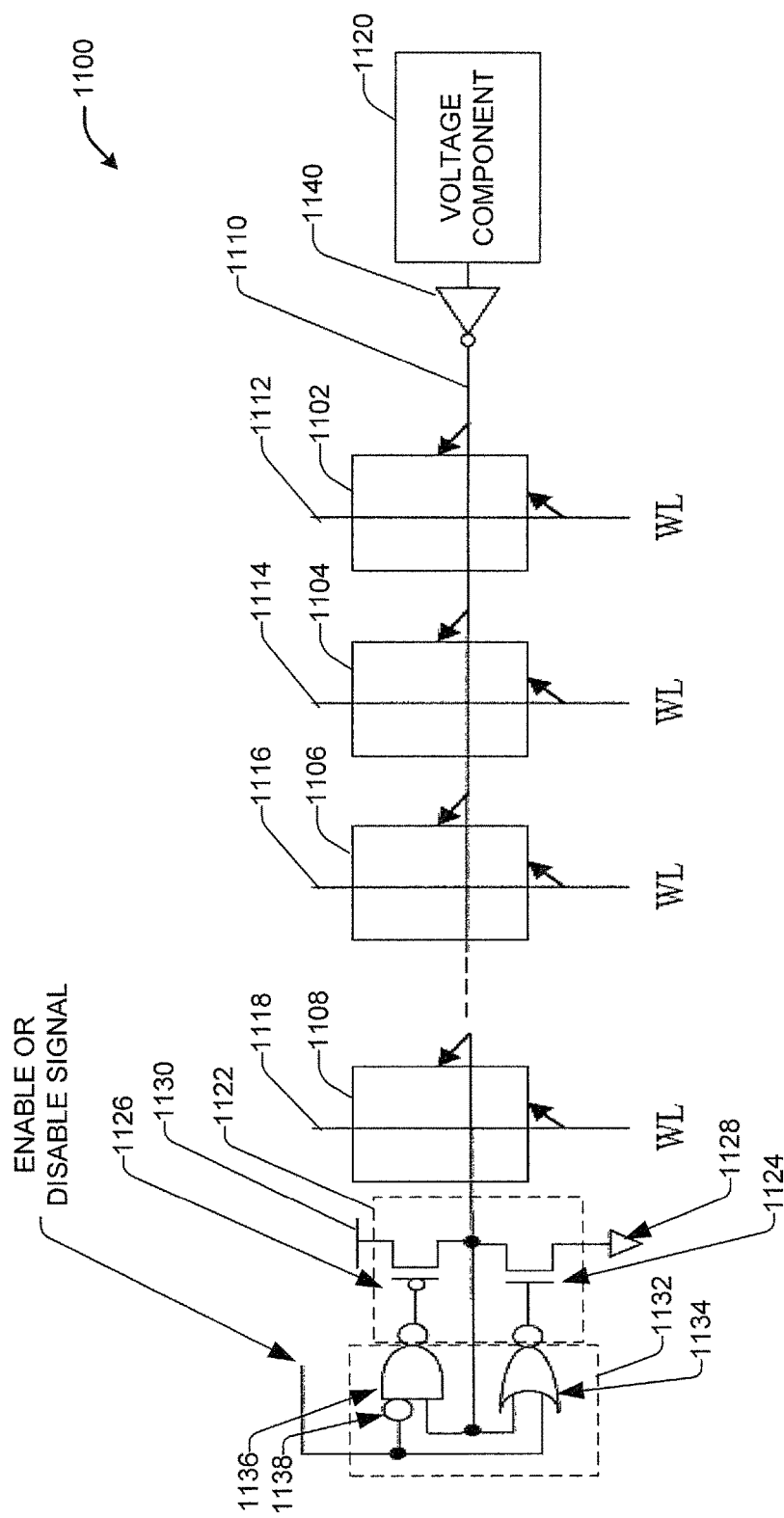
FIG. 11 illustrates a block diagram of an example, non-limiting embodiment of a system that can enable or disable a shunt to facilitate controlling use of write assists to efficiently perform write operations in a memory, in accordance with various aspects and embodiments of the disclosed subject matter.

FIG. 11 illustrates a block diagram of an example, non-limiting embodiment of a system 1100 that can enable or disable a shunt to facilitate controlling use of write assists to efficiently perform write operations in a memory, in accordance with various aspects and embodiments of the disclosed subject matter. The system 1100 can be or can be part of a memory, for example.

The system 1100 can comprise a set of memory cells, comprising memory cell$_1$ 1102, memory cell$_2$ 1104, memory cell$_3$ 1106, up through memory cell$_n$ 1108, wherein n can be virtually any desired integer number. The set of memory cells (e.g., 1102, 1104, 1106, 1108, . . . ) can comprise, for example, memory cells that can use pass transistor logic, use complementary or differential bit lines, and/or use single ended read and write bit lines. For example, the set of memory cells can comprise SRAM cells. It is to be appreciated and understood that other types of memory cells can be employed in memory of the system 1100, in accordance with various aspects and embodiments of the disclosed subject matter. The memory, comprising the set of memory cells, can comprise volatile memory or non-volatile memory.

The set of memory cells (e.g., 1102, 1104, 1106, 1108, . . . ) can be associated with (e.g., connected to) a bit line 1110 that can facilitate writing data (e.g., one or more bits of data having data values, such as a "0" or "low", or a "1" or "high") to respective memory cells (e.g., 1102, 1104, 1106, 1108, . . . ) of the set of memory cells when one or more of the respective memory cells are selected for a write operation. The respective memory cells of the set of memory cells can be associated with (e.g., connected to) respective word lines of a set of word lines, comprising word line$_1$ 1112, word line$_2$ 1114, word line$_3$ 1116, up through word line$_n$ 1118. During a write operation, a desired voltage level from a voltage source (not shown in FIG. 11) can be applied to a desired word line (e.g., word line$_n$ 1118) to activate the word line to facilitate writing a data value being applied to the bit line 1110 to the desired memory cell (e.g., memory cell$_n$ 1108) associated with the desired word line$_n$, wherein the data value can be based at least in part on a voltage level (e.g., the write voltage) applied to the bit line 1110 associated with the desired memory cell.

It is to be appreciated and understood that, for reasons of brevity and clarity, in the system 1100, only one bit line (e.g., bit line 1110), one set of memory cells (e.g., 1102, 1104, 1106, 1108, . . . ), and one set of word lines (e.g., 1112, 1114, 1116, 1118, . . . ) are depicted. It is to be appreciated and understood that the system 1100 can comprise one or more additional sets of memory cells that can be respectively associated with one or more additional bit lines and respective word lines of the set of word lines. In some implementations, each memory cell of the set of memory cells can be associated with complementary bit lines.

The system 1100 can comprise a voltage component 1120 that, during a write operation, can apply a particular voltage level (e.g., a particular write voltage) to the bit line 1110 to facilitate storing a particular data value, which can correspond to the particular voltage level, in a memory cell(s) (e.g., 1102, 1104, 1106, 1108, . . . ) that has been activated for the write operation (e.g., by applying a specified voltage to the write line(s) associated with the memory cell(s)). For instance, the particular voltage level can be a first voltage level that can correspond to a first data value (e.g., "0" or "low" data value) or a second voltage level that can correspond to a second data value (e.g., "1" or "high" data value).

As disclosed, bit line resistance in a bit line can present a potential writability problem during certain write operations to certain memory cells, such as memory cells at or near the other end of the bit line that is opposite to the end of the bit line where the driver (e.g., voltage component) is located. To facilitate overcoming potential writability problems, the system 1100 can comprise a write assist component 1122 that can be associated with (e.g., connected to) the bit line 1110 at or in relative proximity to the far end of the bit line 1110 that is at the opposite end of the bit line 1110 from the other end of the bit line 1110 where the voltage component 1120 is located. By being associated with the bit line 1110, the write assist component 1122 also can be associated with the set of memory cells (e.g., 1102, 1104, 1106, 1108, . . . ) associated with the bit line 1110.

In accordance with various implementations, the write assist component 1122 can comprise a first transistor 1124 and a second transistor 1126, wherein the first transistor 1124 can be an NMOS and the second transistor 1126 can be a PMOS transistor. The first transistor 1124 can facilitate creating an additional current path to the ground 1128, for example, when the gate of the first transistor 1124 receives a high signal (e.g., a "1" or "high" voltage) to turn on the first transistor 1124. The second transistor 1126 can facilitate creating an additional current path to a power supply component 1130, for example, when the gate of the second transistor 1126 receives a low signal (e.g., a "0" or "low" voltage) to turn on the second transistor 1126.

The system 1100 also can comprise a shunt control component 1132 that can facilitate controlling the use of write assists by the write assist component 1122 to efficiently perform write operations in a memory, in accordance with various aspects and embodiments of the disclosed subject matter. The shunt control component 1132 can comprise a NOR component 1134 (e.g., a NOR gate) that can produce an output signal based on the input signals it receives and the NOR logic employed by the NOR component 1134. The output of the NOR component 1134 can be connected to the gate of the first transistor 1124 (e.g., NMOS) of the write assist component 1122. The inputs to the NOR component 1134 can be a shunt signal (e.g., an enable signal to enable the shunt control component 1132, or a disable signal to disable the shunt control component 1132) and the write signal from the bit line 1110. It is noted that the inverter portion of the output of the NOR gate is depicted as being part of the write assist component 1122 in order to have the write assist component 1122 be consistent with other write assist components disclosed herein that can comprise an inverter between the bit line and the transistor (e.g., NMOS).

The shunt control component 1132 also can comprise a NAND component 1136 (e.g., a NAND gate) that can produce an output signal based on the input signals it receives and the NAND logic employed by the NAND component 1136. The inputs to the NAND component 1136 can be an inverted shunt signal (e.g., an inverter 1138 at one input of the NAND component 1136 can receive the shunt signal and can invert it to produce the inverted shunt signal) and the write signal from the bit line 1110. It is noted that the inverter portion at the output of the NAND component 1136 is depicted as being part of the write assist component 1122 in order to have the write assist component 1122 be consistent with other write assist components disclosed herein that can comprise an inverter between the bit line and the transistor (e.g., PMOS).

During operation of the memory, the shunt control component 1132 can receive a default shunt signal (e.g., a default disable shunt signal) that can disable the write assist component 1122 during times when there is no write operation being performed on any of the memory cells in the set of memory cells (e.g., 1102, 1104, 1106, 1108, . . . ) associated with the bit line 1110 in the memory. The default (e.g., default disable) shunt signal can be generated and asserted (e.g., provided to the input of the shunt control component 1132) as a default to facilitate disabling the write assist component 1122 at times when no write operation is being performed on any of the memory cells in the set of memory cells (e.g., 1102, 1104, 1106, 1108, . . . ) associated with the bit line 1110.

During a write operation, a desired write voltage can be applied to the bit line 1110 to facilitate writing data to a memory cell(s) (e.g., memory cell$_n$ 1108) associated with the bit line 1110, wherein the desired write voltage can correspond to a data value to be written to the memory cell(s) associated with the bit line 1110. After the desired write voltage has been applied to the bit line 1110 (e.g., after the write data has been established on the bit line 1110), an enable signal can be generated and provided to the input of the shunt control component 1132 to enable the write assist component 1122 (e.g., to de-assert the default disabling of the shunt) to perform a write assist in connection with the write operation. The shunt control component 1132 can receive the enable signal at its input, and, in response, the shunt control component 1132 can facilitate enabling the write assist component 1122.

In response to the enabling of the write assist component 1122, the write assist component 1122 can create (e.g., add, initiate) an additional current path to the ground 1128 or the power supply component 1130, which can control, mitigate (e.g., mitigate the effects of), or reduce bit line resistance associated with the bit line 1110 during the write operation to facilitate efficient and successful writing of the data to the memory cell(s). For example, in an instance of a write operation to write a "0" or "low" data value to the memory cell(s) (e.g., memory cell$_n$ 1108, when the write circuit associated with the memory cell$_n$ 1108 comprises NMOSs), the write assist component 1122 can be enabled with respect to first transistor 1124 (e.g., an NMOS transistor), based on a "1" or "high" signal being applied to the gate of the first transistor 1124 of the write assist component 1122 to create the additional current path to the ground 1128 during the write operation. In an instance of a write operation to write a "1" or "high" data value to the memory cell(s) (e.g., memory cell$_n$ 1108, when the write circuit associated with the memory cell$_n$ 1108 comprises PMOSs), the write assist component 1122 can be enabled with respect to a second transistor (e.g., a PMOS transistor), based on a "0" or "low" signal being applied to the gate of the second transistor 1126 of the write assist component 1122 to create the additional current path to the power supply component 1130 during the write operation.

The data value on the bit line 1110 can be written to (e.g., stored in) the memory cell(s) (e.g., memory cell$_n$ 1108). The data written to the memory cell(s) can be a "0" or "low" data value, or can be a "1" or "high" data value, based at least in part on (and corresponding to) the desired write voltage (e.g., a low write voltage or a high write voltage) applied to the bit line 1110 by the voltage component 1120 via an inverter 1140 associated with (e.g., situated between) the bit line 1110 and the voltage component 1120, in connection with the write operation.

Figure 12:
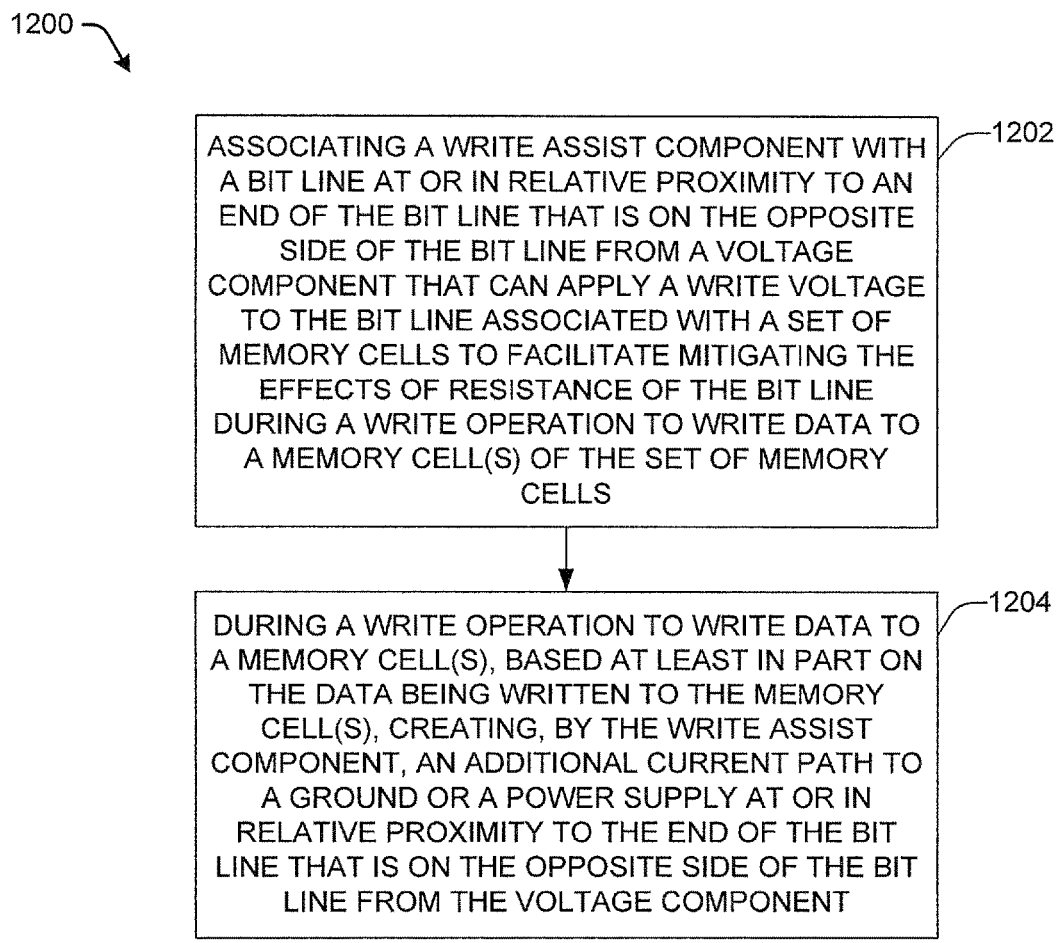
FIG. 12 depicts a flow diagram of an example method that can utilize write assists to efficiently perform write operations in a memory, in accordance with various aspects and embodiments of the disclosed subject matter.
Figure 13:
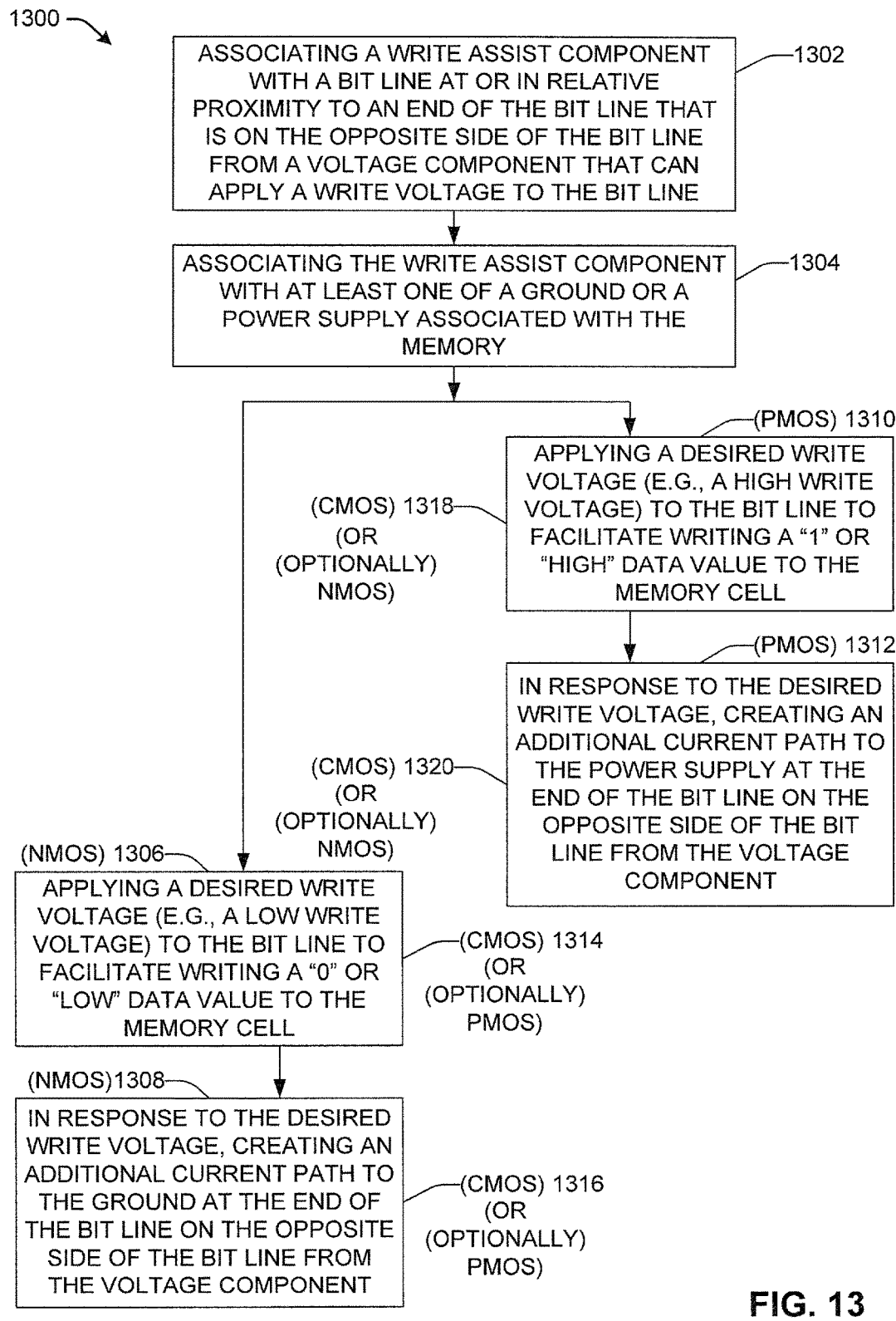
FIG. 13 illustrates a flow diagram of another example method that can utilize write assists to efficiently perform write operations in a memory, in accordance with various aspects and embodiments of the disclosed subject matter.
Figure 14:
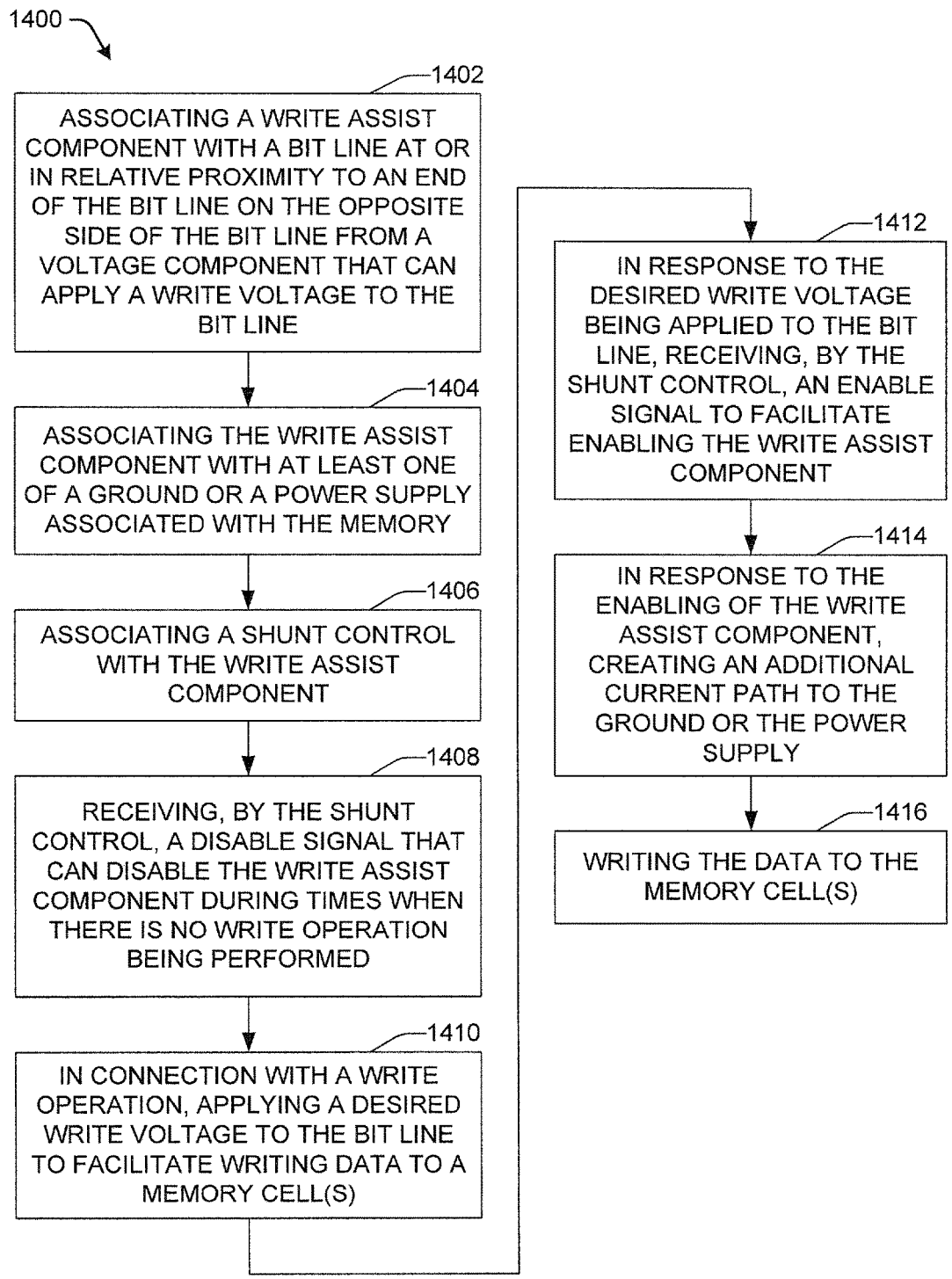
FIG. 14 presents a flow diagram of an example method that can employ a disable shunt to facilitate controlling the use of write assists to efficiently perform write operations in a memory, in accordance with various aspects and embodiments of the disclosed subject matter.

In view of the example systems described above, methods that may be implemented in accordance with the described subject matter may be better appreciated with reference to the flow charts of FIGS. 12-14. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 12 depicts a flow diagram of an example method 1200 that can utilize write assists to efficiently perform write operations in a memory, in accordance with various aspects and embodiments of the disclosed subject matter. The method 1200 can be implemented in the memory, for example.

At block 1202, a write assist component can be associated with (e.g., connected to, formed on) a bit line at or in relative proximity to an end of the bit line (e.g., write bit line) that is on the opposite side of the bit line from a voltage component that can apply a write voltage to the bit line associated with a set of memory cells to facilitate mitigating the effects of resistance of the bit line during a write operation to write data to a memory cell(s) of the set of memory cells. The configuration of the write assist component can be based at least in part on the type of transistors employed in the write circuits associated with the memory cells of the set of memory cells. For example, a first type of write assist component can be employed when the transistors of the write circuits associated with the set of memory cells are NMOSs, a second type of write assist component can be employed when the transistors of the write circuits associated with the set of memory cells are PMOSs, and a third type of write assist component can be employed when the transistors of the write circuits associated with the set of memory cells are either NMOSs or PMOSs, as more fully described herein.

At block 1204, during a write operation to write data to the memory cell(s), based at least in part on the data being written to the memory cell(s), an additional current path can be created (e.g., created, added, or initiated by the write assist component) to a ground or a power supply at or in relative proximity to the end of the bit line (e.g., write bit line) that is on the opposite side of the bit line from the voltage component that applies a write voltage to the bit line. The write assist component can be employed to create (e.g., add, initiate, form) an additional current path to the ground or the power supply (e.g., power supply component), for example, when an appropriate write polarity (e.g., an appropriate write voltage based on the type of transistors employed in the write circuit(s) associated with the memory cell(s)) is applied to the bit line during a write operation.

If the write circuits associated with the set of memory cells comprises transistors that are NMOSs, the write assist component can be configured to create the additional current path to ground to facilitate mitigating the effects of the bit line resistance when a "1" or "high" data value is stored in the memory cell(s) and a "0" or "low" voltage is applied to the bit line to facilitate writing a "0" or "low" data value to the memory cell(s). If the write circuits associated with the set of memory cells comprises transistors that are PMOSs, the write assist component can create the additional current path to the power supply to facilitate mitigating the effects of the bit line resistance when a "0" or "low" data value is stored in the memory cell(s) and a "1" or "high" voltage is applied to the bit line to facilitate writing a "1" or "high" data value to the memory cell(s).

FIG. 13 illustrates a flow diagram of another example method 1300 that can utilize write assists to efficiently perform write operations in a memory, in accordance with various aspects and embodiments of the disclosed subject matter. The method 1300 can be implemented in the memory, for example.

At block 1302, a write assist component can be associated with (e.g., connected to, formed on) a bit line at or in relative proximity to an end of a bit line (e.g., write bit line) that is on the opposite side of the bit line from a voltage component that can apply a write voltage to the bit line associated with a set of memory cells. The write assist component can operate to facilitate mitigating the effects of the resistance of the bit line during a write operation to write data to a memory cell(s) of the set of memory cells. At block 1304, the write assist component can be associated with at least one of a ground or a power supply associated with the memory.

The configuration of the write assist component can be based at least in part on the type of transistors employed in the memory cells of the set of memory cells. For example, a first type of write assist component can be employed when the transistors of the write circuits associated with the set of memory cells are NMOSs, a second type of write assist component can be employed when the transistors of the write circuits associated with the set of memory cells are PMOSs, or a third type of write assist component can be employed when the transistors of the write circuits associated with the set of memory cells are either NMOSs or PMOSs, as more fully described herein. While not a typical case, in some implementations, the third type of write assist component alternatively can be employed when the transistors of the write circuits associated with the set of memory cells are CMOSs, as more fully described herein.

When the write assist component is the first type of write assist component, the write assist component can comprise an inverter and an NMOS, and can be associated with the ground, as more fully described herein. When the write assist component is the second type of write assist component, the write assist component can comprise an inverter and a PMOS, and can be associated with the power supply, as more fully described herein. When the write assist component is the third type of write assist component, the write assist component can comprise an inverter, an NMOS, and a PMOS, and can be associated with the ground or the power supply (depending in part on the data being written to the memory cell(s)), as more fully described herein.

At block 1306, with regard to a write operation to write a "0" or "low" data value to a memory cell, which is associated with a write circuit that comprises NMOSs, and which has a "1" or "high" data value stored in the memory cell, a desired write voltage (e.g., a low write voltage) can be applied to the bit line to facilitate writing the "0" or "low" data value to the memory cell. At block 1308, in response to the desired (e.g., low) write voltage being applied to the bit line, an additional current path to the ground can be created (e.g., can be added, initiated, or formed by the write assist component (e.g., the first type of write assist component)) at the end of the bit line on the opposite side of the bit line from the voltage component.

Alternatively, at block 1310, with regard to a write operation to write a "1" or "high" data value to a memory cell, which is associated with a write circuit that comprises PMOSs, and which has a "0" or "low" data value stored in the memory cell, a desired write voltage (e.g., a high write voltage) can be applied to the bit line to facilitate writing the "1" or "high" data value to the memory cell. At block 1312, in response to the desired (e.g., high) write voltage being applied to the bit line, an additional current path to the power supply (e.g., power supply component) can be created (e.g., can be added, initiated, or formed by the write assist component (e.g., the second type of write assist component)) at the end of the bit line on the opposite side of the bit line from the voltage component.

Alternatively, at block 1314, with regard to a write operation to write a "0" or "low" data value to a memory cell, which is associated with a write circuit that comprises CMOSs, and which has a "1" or "high" data value stored in the memory cell, a desired write voltage (e.g., a low write voltage) can be applied to the bit line to facilitate writing the "0" or "low" data value to the memory cell. At block 1316, in response to the desired (e.g., low) write voltage being applied to the bit line, an additional current path to the ground can be created (e.g., can be added, initiated, or formed by the write assist component (e.g., the third type of write assist component)) at the end of the bit line on the opposite side of the bit line from the voltage component that can facilitate applying the desired write voltage to the bit line.

It is to be appreciated and understood that, while the method 1300 (e.g., at blocks 1306, 1308, 1314, and 1316) is described herein primarily with regard to employing write assists during write operations to write a "0" or "low" data value to a memory cell that has a "1" or "high" data value stored therein in connection with write circuits having either an NMOS configuration or a CMOS configuration, the disclosed subject matter is not limited to such uses. In some implementations, the method 1300 also can be extended (e.g., optionally) to perform write assists during write operations to write a "0" or "low" data value to a memory cell that has a "1" or "high" data value stored therein when the write circuit has a PMOS configuration. For instance, the write assist component 222c of FIG. 9 can be employed to provide a write assist (e.g., by creating an additional current path to the ground) during a write operation to write a "0" or "low" data value to a memory cell (e.g., memory cell$_n$) that has a "1" or "high" data value stored therein. It is noted that the writability issues for writing a "0" or "low" data value to the memory cell when the memory cell currently has a "1" or "high" data value stored therein is not as problematic in a PMOS write-circuit configuration as the writability issues (e.g., due in part to bit line resistance) for writing a "1" or "high" data value to the memory cell when the memory cell currently has a "0" or "low" data value stored therein. As a result, the write assist provided by the write assist component 222c in the former case (e.g., writing a "0" to the memory cell) may not be not as strong or significant as the write assist that the write assist component 222c can provide in the latter case (e.g., writing a "1" to the memory cell). However, such write assist in the former case still can provide some benefit, as, for example, it can still mitigate bit line resistance and/or can speed up performance of write operation (e.g., speed up completion of the write cycle), as compared to the speed of performance of the write operation without the write assist (e.g., the optional write assist) being employed.

Alternatively, at block 1318, with regard to a write operation to write a "1" or "high" data value to a memory cell, which is associated with a write circuit that comprises CMOSs, and which has a "0" or "low" data value stored in the memory cell, a desired write voltage (e.g., a high write voltage) can be applied to the bit line to facilitate writing the "1" or "high" data value to the memory cell. At block 1320, in response to the desired (e.g., high) write voltage being applied to the bit line, an additional current path to the power supply (e.g., power supply component) can be created (e.g., can be added, initiated, or formed by the write assist component (e.g., the first type of write assist component)) at the end of the bit line on the opposite side of the bit line from the voltage component that can facilitate applying the desired write voltage to the bit line.

It is to be appreciated and understood that, although the method 1300 (e.g., at blocks 1310, 1312, 1318, and 1320) is described herein primarily with regard to employing write assists during write operations to write a "1" or "high" data value to a memory cell that has a "0" or "low" data value stored therein in connection with write circuits having either a PMOS configuration or a CMOS configuration, the disclosed subject matter is not limited to such uses. In certain implementations, the method 1300 also can be extended (e.g., optionally) to perform write assists during write operations to write a "1" or "high" data value to a memory cell that has a "0" or "low" data value stored therein when the write circuit has an NMOS configuration. For example, the write assist component 222c of FIG. 9 can be utilized to provide a write assist (e.g., by creating an additional current path to the power supply component) during a write operation to write a "1" or "high" data value to a memory cell (e.g., memory cell$_n$) that has a "0" or "low" data value stored therein. It is noted that the writability issues for writing a "1" or "high" data value to the memory cell when the memory cell has a "0" or "low" data value stored therein is not as problematic in an NMOS write-circuit configuration as the writability issues (e.g., due in part to bit line resistance) for writing a ""0" or "low" data value to the memory cell when the memory cell has a "1" or "high" data value stored therein. As a result, the write assist provided by the write assist component 222c in the former case (e.g., writing a "1" to the memory cell) may not be not as strong or significant as the write assist that the write assist component 222c can provide in the latter case (e.g., writing a "0" to the memory cell). However, such write assist in the former case (e.g., writing a "1" to the memory cell) still can provide some benefit, as, for example, it can still mitigate bit line resistance and/or can speed up performance of write operation as compared to the speed of performance of the write operation without the write assist being employed.

FIG. 14 presents a flow diagram of an example method 1400 that can employ a shunt control (e.g., a shunt control component) to facilitate controlling the use of write assists (e.g., by a write assist component) to efficiently perform write operations in a memory, in accordance with various aspects and embodiments of the disclosed subject matter. The method 1400 can be implemented in the memory, for example.

At block 1402, a write assist component can be associated with (e.g., connected to, formed on) a bit line at or in relative proximity to an end of the bit line (e.g., write bit line) that is on the opposite side of the bit line from a voltage component that can apply a write voltage to the bit line associated with a set of memory cells to facilitate mitigating the effects of resistance of the bit line during a write operation to write data to a memory cell(s) of the set of memory cells. At block 1404, the write assist component can be associated with at least one of a ground or a power supply associated with the memory. The write assist component can comprise an NMOS that can facilitate adding an additional current path to the ground for the bit line. The write assist component also can comprise a PMOS that can facilitate adding an additional current path to the power supply for the bit line.

At block 1406, a shunt control can be associated with (e.g., connected to) the write assist component. For instance, the shunt control can be connected to the gate of the NMOS and the gate of the PMOS of the write assist component. The shunt control (e.g., shunt control component) can comprise a NAND component (e.g., a NAND gate), the output of which can be connected to the gate of the PMOS of the write assist component. The inputs to the NAND component can be an inverted shunt signal (e.g., an inverter at one input of the NAND component can receive the shunt signal and can invert it) and the write signal from the bit line. The shunt control also can comprise a NOR component (e.g., a NOR gate), the output of which can be connected to the gate of the NMOS of the write assist component. The inputs to the NOR component can be the shunt signal and the write signal from the bit line.

At block 1408, the shunt control can receive a disable signal (e.g., a default disable shunt signal) that can disable the write assist component during times when there is no write operation being performed. The disable signal can be generated and asserted (e.g., provided to the input of the shunt control) as a default to disable the write assist component at times when no write operation is being performed on any of the memory cells in the set of memory cells associated with the bit line.

At block 1410, in connection with a write operation, a desired write voltage can be applied to the bit line to facilitate writing data to a memory cell(s) associated with the bit line. At block 1412, in response to the desired write voltage being applied to the bit line, the shunt control can receive an enable signal at its input to facilitate enabling the write assist component. After the desired write voltage has been applied to the bit line (e.g., after the write data has been established on the bit line), an enable signal can be generated and provided to the input of the shunt control to enable the write assist component (e.g., to de-assert the default disable shunt condition).

At block 1414, in response to the enabling of the write assist component, an additional current path to the ground or the power supply can be created (e.g., by the write assist component) to facilitate mitigating the effects of bit line resistance associated with the bit line during the write operation to facilitate efficient and successful writing of the data to the memory cell(s).

At block 1416, the data can be written to (e.g., stored in) the memory cell(s). The data written to the memory cell(s) can be a "0" or "low" data value, or can be a "1" or "high" data value, based at least in part on (and corresponding to) the write voltage (e.g., a low write voltage or a high write voltage) applied to the bit line in connection with the write operation.

Example Computing Environment

Figure 15:
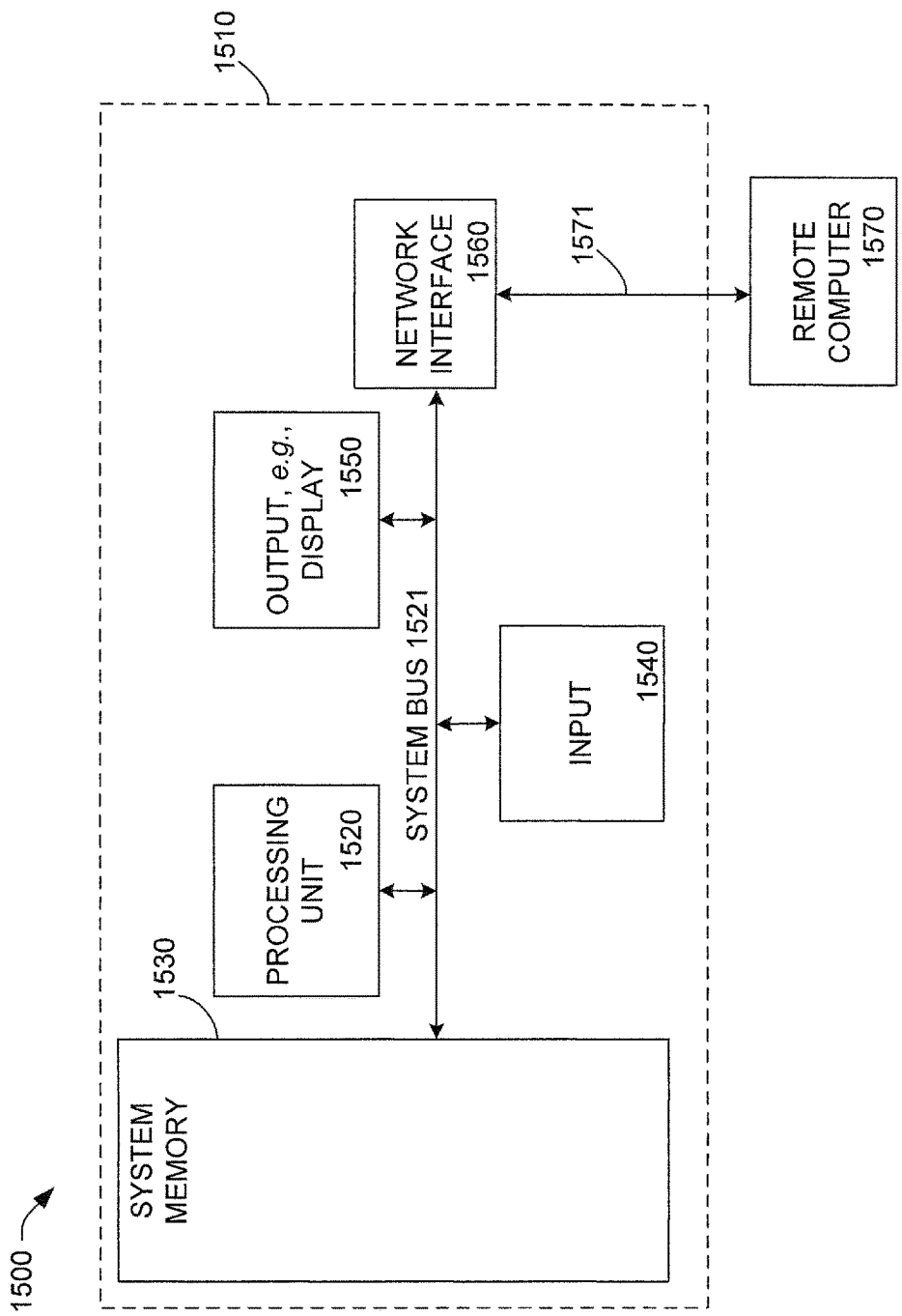
FIG. 15 illustrates a block diagram of an example electronic computing environment that can be implemented in conjunction with one or more aspects described herein.

As mentioned, advantageously, the techniques described herein can be applied to any device and/or network where the communication, writing, and storage of data, including the writing of data to and storage of data in memory cells of a memory, is desirable in a system comprising a device (e.g., a memory device, a transceiver, a transmitter, a computer, a phone, an electronic tablet, an electronic gaming device, a set top box, a digital-to-analog converter, an analog-to-digital converter, a modem, a router, . . . ). It is to be understood, therefore, that handheld, portable and other computing devices and computing objects of all kinds are contemplated for use in connection with the various non-limiting embodiments, e.g., anywhere that it can be desirable for a device to be employed to facilitate communicating, writing, or storing data (e.g., writing or storing data in memory cells of a memory). Accordingly, the below general purpose remote computer described below in FIG. 15 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 15 thus illustrates an example of a suitable computing system environment 1500 in which some aspects of the disclosed subject matter can be implemented, although as made clear above, the computing system environment 1500 is only one example of a suitable computing environment for a device and is not intended to suggest any limitation as to the scope of use or functionality of the disclosed subject matter. Neither should the computing environment 1500 be interpreted as having any dependency or requirement relating to any one or combination of components illustrated in the exemplary operating environment 1500.

With reference to FIG. 15, an exemplary device for implementing the disclosed subject matter includes a general-purpose computing device in the form of a computer 1510. Components of computer 1510 may include, but are not limited to, a processing unit 1520, a system memory 1530, and a system bus 1521 that couples various system components including the system memory to the processing unit 1520. The system bus 1521 may be any of several types of bus structures including a memory bus or memory controller, a peripheral bus, and a local bus using any of a variety of bus architectures.

Computer 1510 typically includes a variety of computer readable media. Computer readable media can be any available media that can be accessed by computer 1510. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1510. Communication media typically embodies computer readable instructions, data structures, program modules, or other data in a modulated data signal such as a carrier wave or other transport mechanism and includes any information delivery media.

The system memory 1530 may include computer storage media in the form of volatile and/or nonvolatile memory such as read only memory (ROM) and/or random access memory (RAM). A basic input/output system (BIOS), containing the basic routines that help to transfer information between elements within computer 1510, such as during start-up, may be stored in memory 1530. Memory 1530 typically also contains data and/or program modules that are immediately accessible to and/or presently being operated on by processing unit 1520. By way of example, and not limitation, memory 1530 may also include an operating system, application programs, other program modules, and program data.

The computer 1510 may also include other removable/non-removable, volatile/nonvolatile computer storage media. For example, computer 1510 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1521 through a non-removable memory interface such as an interface, and a magnetic disk drive or optical disk drive is typically connected to the system bus 1521 by a removable memory interface, such as an interface.

A user can enter commands and information into the computer 1510 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1520 through user input 1540 and associated interface(s) that are coupled to the system bus 1521, but may be connected by other interface and bus structures, such as a parallel port, game port, or a universal serial bus (USB). A graphics subsystem can also be connected to the system bus 1521. A projection unit in a projection display device, or a HUD in a viewing device or other type of display device can also be connected to the system bus 1521 via an interface, such as output interface 1550, which may in turn communicate with video memory. In addition to a monitor, computers can also include other peripheral output devices such as speakers which can be connected through output interface 1550.

The computer 1510 can operate in a networked or distributed environment using logical connections to one or more other remote computer(s), such as remote computer 1570, which can in turn have media capabilities different from device 1510. The remote computer 1570 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 1510. The logical connections depicted in FIG. 15 include a network 1571, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1510 can be connected to the LAN 1571 through a network interface or adapter. When used in a WAN networking environment, the computer 1510 can typically include a communications component, such as a modem, or other means for establishing communications over the WAN, such as the Internet. A communications component, such as wireless communications component, a modem and so on, which can be internal or external, can be connected to the system bus 1521 via the user input interface of input 1540, or other appropriate mechanism. In a networked environment, program modules depicted relative to the computer 1510, or portions thereof, can be stored in a remote memory storage device. It will be appreciated that the network connections shown and described are exemplary and other means of establishing a communications link between the computers can be used.

Example Networking Environment

Figure 16:
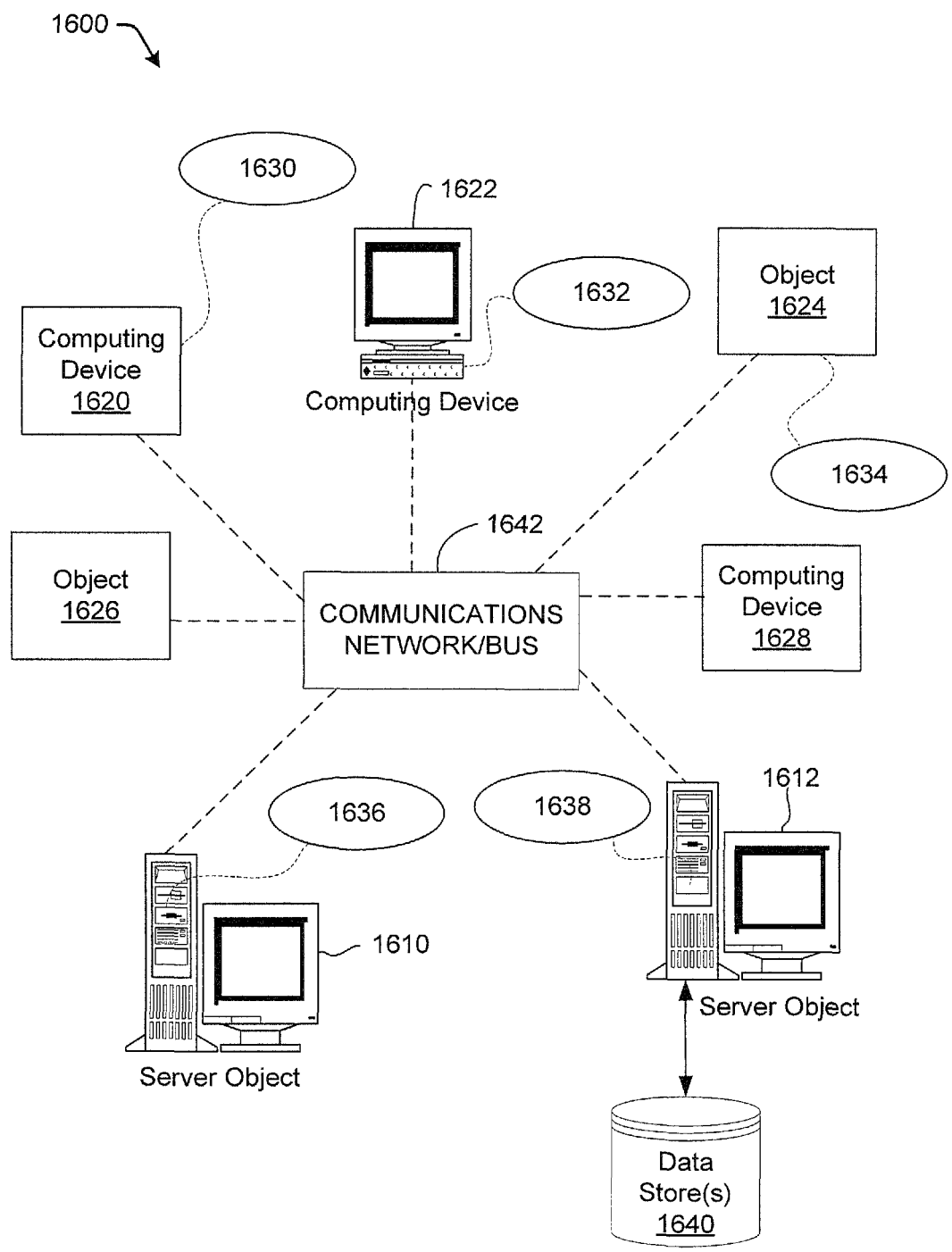
FIG. 16 illustrates a block diagram of an example data communication network that can be operable in conjunction with various aspects described herein.

FIG. 16 provides a schematic diagram of an exemplary networked or distributed computing environment 1600. The distributed computing environment comprises computing objects 1610, 1612, etc. and computing objects or devices 1620, 1622, 1624, 1626, 1628, etc., which may include programs, methods, data stores, programmable logic, etc., as represented by applications 1630, 1632, 1634, 1636, 1638 and data store(s) 1640. It can be appreciated that computing objects 1610, 1612, etc. and computing objects or devices 1620, 1622, 1624, 1626, 1628, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1640 can include one or more cache memories, one or more registers, or other similar data stores disclosed herein.

Each computing object 1610, 1612, etc. and computing objects or devices 1620, 1622, 1624, 1626, 1628, etc. can communicate with one or more other computing objects 1610, 1612, etc. and computing objects or devices 1620, 1622, 1624, 1626, 1628, etc. by way of the communications network 1642, either directly or indirectly. Even though illustrated as a single element in FIG. 16, communications network 1642 may comprise other computing objects and computing devices that provide services to the system of FIG. 16, and/or may represent multiple interconnected networks, which are not shown. Each computing object 1610, 1612, etc. or computing object or devices 1620, 1622, 1624, 1626, 1628, etc. can also contain an application, such as applications 1630, 1632, 1634, 1636, 1638, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 16, as a non-limiting example, computing objects or devices 1620, 1622, 1624, 1626, 1628, etc. can be thought of as clients and computing objects 1610, 1612, etc. can be thought of as servers where computing objects 1610, 1612, etc., acting as servers provide data services, such as receiving data from client computing objects or devices 1620, 1622, 1624, 1626, 1628, etc., storing of data, processing of data, transmitting data to client computing objects or devices 1620, 1622, 1624, 1626, 1628, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1642 or bus is the Internet, for example, the computing objects 1610, 1612, etc. can be Web servers with which other computing objects or devices 1620, 1622, 1624, 1626, 1628, etc. communicate via any of a number of known protocols, such as the hypertext transfer protocol (HTTP). Computing objects 1610, 1612, etc. acting as servers may also serve as clients, e.g., computing objects or devices 1620, 1622, 1624, 1626, 1628, etc., as may be characteristic of a distributed computing environment.

Reference throughout this specification to "one embodiment," "an embodiment," "an example," "an implementation," "a disclosed aspect," or "an aspect" means that a particular feature, structure, or characteristic described in connection with the embodiment, implementation, or aspect is included in at least one embodiment, implementation, or aspect of the present disclosure. Thus, the appearances of the phrase "in one embodiment," "in one example," "in one aspect," "in an implementation," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methodologies for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

The invention claimed is:

1. A method for writing data to a memory, comprising:
   associating a set of memory cells with a bit line of the memory, the bit line being associated with a first current path to a ground or a power supply; and
   during a write operation on a memory cell of the set of memory cells, forming at least one additional current path to the ground or the power supply to facilitate mitigating an effect of a resistance associated with the bit line to facilitate performing the write operation on the memory cell.

2. The method of claim 1, further comprising:
   during the write operation to write data to the memory cell, applying a write voltage to the bit line; and
   applying a word line voltage to a word line associated with the memory cell to activate the memory cell to facilitate the writing of the data to the memory cell.

3. The method of claim 1, further comprising:
   associating a write driver with the bit line at a first end of the bit line, wherein the write driver facilitates applying a write voltage to the bit line during the write operation to write data to the memory cell; and
   associating a write assist component with the bit line at or in proximity to a second end of the bit line that is opposite of the first end of the bit line, wherein the write assist component facilitates the creating of the at least one additional current path to the ground or the power supply.

4. The method of claim 1, further comprising:
   receiving, from the bit line, a write voltage signal having a first value at an input of an inverter of a write assist component;
   inverting the write voltage signal to produce an inverted signal having a second value at an output of the inverter, the second value being inverted from the first value;
   applying the inverted signal to a gate of at least one transistor to facilitate controlling a switching state of the at least one transistor; and
   controlling the forming of the at least one additional current path to the ground or the power supply based on the second value of the inverted signal applied to the gate.

5. The method of claim 4, wherein the at least one transistor comprises an n-channel metal-oxide-semiconductor field-effect transistor, and wherein the forming comprises forming the at least one additional current path to the ground to facilitate the mitigating of the effect of the resistance associated with the bit line to facilitate the performing of the write operation on the memory cell.

6. The method of claim 4, wherein the at least one transistor comprises a p-channel metal-oxide-semiconductor field-effect transistor, and wherein the forming comprises forming the at least one additional current path to the power supply to facilitate the mitigating of the effect of the resistance associated with the bit line to facilitate the performing of the write operation on the memory cell.

7. The method of claim 4, wherein the at least one transistor comprises an n-channel metal-oxide-semiconductor field-effect transistor and a p-channel metal-oxide-semiconductor field-effect transistor, and the forming comprises forming the at least one additional current path to the ground via the n-channel metal-oxide-semiconductor field-effect transistor or to the power supply via the p-channel metal-oxide-semiconductor field-effect transistor, to facilitate the mitigating of the effect of the resistance associated with the bit line to facilitate the performing of the write operation on the memory cell.

8. The method of claim 1, further comprising:
   associating a first write assist component with the bit line to facilitate the forming of the at least one additional current path to the ground or the power supply during the write operation; and
   associating a second write assist component with a second bit line associated with the set of memory cells to facilitate forming at least one additional second current path to the ground or the power supply during the write operation, wherein the second bit line is a complement of the bit line.

9. The method of claim 1, further comprising:
   applying a disable signal to a write assist component associated with the bit line during a time when no write operation is being performed on the set of memory cells to maintain the write assist component in a disabled state; and
   applying an enable signal to the write assist component during the write operation on the memory cell of the set of memory cells to facilitate enabling the write assist component during the write operation, wherein the forming comprises forming the at least one additional current path to the ground or the power supply based on the enabling of the write assist component.

10. A device, comprising:
a set of memory cells of a memory, the set of memory cells being associated with a bit line of a set of bit lines of the memory, and the bit line being associated with a current path to a ground or to a power supply component;
a set of word lines of the memory, respective word lines of the set of word lines being associated with respective memory cells of the set of memory cells;
a voltage component that applies a write voltage to a memory cell of the set of memory cells during a write operation to write data to the memory cell; and
a write assist component that, during the write operation, creates at least one additional current path to the ground or the power supply component to facilitate controlling a resistance associated with the bit line to facilitate the writing of the data to the memory cell, the voltage component being associated with the bit line at a first end of the bit line and the write assist component being associated with the bit line at or within a defined distance of a second end of the bit line that is opposite of the first end of the bit line.

11. The device of claim 10, wherein the device comprises a memory device, a transceiver, a transmitter, a computer, a phone, an electronic tablet, an electronic gaming device, a set top box, a digital-to-analog converter, an analog-to-digital converter, a modem, or a router.

\* \* \* \* \*